US012232385B2

(12) United States Patent
Xu et al.

(10) Patent No.: US 12,232,385 B2
(45) Date of Patent: Feb. 18, 2025

(54) DISPLAY SUBSTRATE AND DISPLAY PANEL

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Jingbo Xu, Beijing (CN); Xueguang Hao, Beijing (CN); Jingquan Wang, Beijing (CN); Xinyin Wu, Beijing (CN); Lu Bai, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/551,067

(22) PCT Filed: Aug. 24, 2022

(86) PCT No.: PCT/CN2022/114515
§ 371 (c)(1),
(2) Date: Sep. 18, 2023

(87) PCT Pub. No.: WO2023/030131
PCT Pub. Date: Mar. 9, 2023

(65) Prior Publication Data
US 2024/0172508 A1  May 23, 2024

(30) Foreign Application Priority Data
Sep. 3, 2021  (CN) .......................... 202111033089.8

(51) Int. Cl.
G09G 3/3233  (2016.01)
G02F 1/1362  (2006.01)
(Continued)

(52) U.S. Cl.
CPC ..... *H10K 59/131* (2023.02); *G02F 1/136286* (2013.01); *G02F 1/1368* (2013.01);
(Continued)

(58) Field of Classification Search
None
See application file for complete search history.

(56) References Cited

U.S. PATENT DOCUMENTS 10,692,438 B2   6/2020  Yang
2008/0048709 A1  2/2008  Lee et al.
(Continued)

FOREIGN PATENT DOCUMENTS

CN   101114005 A   1/2008
CN   106991990 A   7/2017
(Continued)

OTHER PUBLICATIONS

Translation of CN-107945736-A into English; Ding et al. (Year: 2018).*
(Continued)

*Primary Examiner* — Brian M Butcher

(57) ABSTRACT

A display substrate and a display panel are disclosed. The display substrate includes a base substrate, and the base substrate includes a display region and a peripheral region on at least one side of the display region. The display region includes pixel units arranged in an array, first gate scanning signal lines, and second gate scanning signal lines; the peripheral region includes a first scanning driving circuit connected to the first gate scanning signal lines through first connection wires, a first scanning driving circuit connected to the second gate scanning signal lines through second connection wires, a first voltage signal line configured to provide a first voltage, and a second voltage signal line configured to provide a second voltage, and the second (Continued)

scanning driving circuit is on a side of the first scanning driving circuit close to the display region. The following is a clean version of the amended Abstract with the above-indicated changes/markings incorporated.

20 Claims, 10 Drawing Sheets

(51) Int. Cl.
  *G02F 1/1368* (2006.01)
  *G09G 3/3266* (2016.01)
  *G09G 3/36* (2006.01)
  *H10K 59/122* (2023.01)
  *H10K 59/131* (2023.01)
  *H10K 59/80* (2023.01)

(52) U.S. Cl.
  CPC ......... *G09G 3/3233* (2013.01); *G09G 3/3266* (2013.01); *G09G 3/3677* (2013.01); *H10K 59/122* (2023.02); *H10K 59/80516* (2023.02); *H10K 59/80522* (2023.02); *G09G 2300/0426* (2013.01); *G09G 2300/0819* (2013.01); *G09G 2300/0842* (2013.01); *G09G 2300/0861* (2013.01); *G09G 2310/0286* (2013.01)

(56) References Cited

U.S. PATENT DOCUMENTS

| | | | |
|---|---|---|---|
| 2017/0219862 A1* | 8/2017 | Mochizuki | ............ H01L 27/124 |
| 2018/0342194 A1 | 11/2018 | Li et al. | |
| 2018/0342572 A1 | 11/2018 | Park et al. | |
| 2019/0096978 A1 | 3/2019 | Jung et al. | |
| 2019/0318693 A1 | 10/2019 | Jung et al. | |
| 2021/0027696 A1 | 1/2021 | Kim et al. | |
| 2021/0090504 A1 | 3/2021 | Kim et al. | |
| 2021/0134219 A1 | 5/2021 | Huang et al. | |
| 2022/0068212 A1 | 3/2022 | Yao et al. | |
| 2022/0310010 A1 | 9/2022 | Cheng et al. | |

FOREIGN PATENT DOCUMENTS

| | | | | | |
|---|---|---|---|---|---|
| CN | 107945736 A | * | 4/2018 | ........... | G06F 3/0412 |
| CN | 108877544 A | | 11/2018 | | |
| CN | 109461412 A | | 3/2019 | | |
| CN | 109584815 A | | 4/2019 | | |
| CN | 110033734 A | | 7/2019 | | |
| CN | 110390901 A | | 10/2019 | | |
| CN | 111128080 A | | 5/2020 | | |
| CN | 111816691 A | | 10/2020 | | |
| CN | 112838109 A | | 5/2021 | | |
| CN | 112992246 A | | 6/2021 | | |
| CN | 113192463 A | | 7/2021 | | |
| CN | 113471225 A | | 10/2021 | | |
| EP | 3 961 611 A1 | | 3/2022 | | |
| KR | 20170126183 A | | 11/2017 | | |

OTHER PUBLICATIONS

International Search Report mailed Nov. 23, 2022; PCT/CN2022/114515.

The Extended European Search Report dated May 15, 2024; Appln. No. 22863270.9.

* cited by examiner

DISPLAY SUBSTRATE AND DISPLAY PANEL

CROSS-REFERENCE TO RELATED APPLICATION

This application is a National Stage of International Application No. PCT/CN2022/114515, filed 24 Aug. 2022, which claims the benefit of and priority to Chinese patent application No. 202111033089.8, filed Sep. 3, 2021, the entireties of which are hereby incorporated herein by reference as a portion of the present application.

TECHNICAL FIELD

Embodiments of the present disclosure relate to a display substrate and a display panel.

BACKGROUND

In the field of display technology, for example, the pixel array of a liquid crystal display panel or an organic light-emitting diode (Organic Light-Emitting Diode, OLED) display panel usually includes a plurality of rows of gate lines and a plurality of columns of data lines that intersect with the gate lines. Driving of the gate lines can be implemented by a bound integrated driving circuit. In recent years, with the continuous improvement of the manufacturing process of amorphous silicon thin film transistors or oxide thin film transistors, a gate line driving circuit can also be directly integrated on a thin film transistor array substrate to form a GOA (Gate driver On Array) to drive the gate lines. For example, a GOA including a plurality of cascaded shift register units can be used to provide switch state voltage signals (scanning signals) for the plurality of rows of gate lines of the pixel array, thereby controlling the plurality of rows of gate lines to be turned on sequentially, and at the same time, data signals are provided by the data lines to pixel units of a corresponding row in the pixel array, so as to form gray voltages required for displaying each grayscale of an image in each pixel unit, and then display a frame of image.

SUMMARY

At least one embodiment of the present disclosure provides a display substrate, which comprises: a base substrate, wherein the base substrate comprises a display region and a peripheral region on at least one side of the display region, and the display region comprises a plurality of rows and columns of pixel units arranged in an array, a plurality of first gate scanning signal lines respectively connected to light-emitting control sub-circuits of a plurality of rows of pixel units in the plurality of rows and columns of pixel units, and a plurality of second gate scanning signal lines respectively connected to first reset sub-circuits of the plurality of rows of pixel units; the peripheral region comprises: a first scanning driving circuit, respectively connected to the plurality of first gate scanning signal lines through a plurality of first connection wires to respectively provide light-emitting control signals to the light-emitting control sub-circuits of the plurality of rows of pixel units, wherein a resistance value of each of the first connection wires is a first resistance value; a second scanning driving circuit, on a side of the first scanning driving circuit close to the display region, and respectively connected to the plurality of second gate scanning signal lines through a plurality of second connection wires to respectively provide first reset control signals to the first reset sub-circuits of the plurality of rows of pixel units, wherein a resistance value of each of the second connection wires is a second resistance value; a first voltage signal line, configured to provide a first voltage; and a second voltage signal line, configured to provide a second voltage; the first scanning driving circuit is connected to the first voltage signal line to output the first voltage as a first portion of the light-emitting control signal, the second scanning driving circuit is connected to the second voltage signal line to output the second voltage as a first portion of the first reset control signal, and a ratio of the second resistance value to the first resistance value is less than a ratio of an average line width of the second voltage signal line to an average line width of the first voltage signal line.

For example, in the display substrate provided by at least one embodiment of the present disclosure, the peripheral region further comprises: a third voltage signal line, configured to provide a third voltage; and a fourth voltage signal line, configured to provide a fourth voltage; the first scanning driving circuit is further connected to the third voltage signal line to output the third voltage as a second portion of the light-emitting control signal; the second scanning driving circuit is further connected to the fourth voltage signal line to output the fourth voltage as a second portion of the first reset control signal; and the third voltage is less than the first voltage, and the fourth voltage is less than the second voltage.

For example, in the display substrate provided by at least one embodiment of the present disclosure, the ratio of the second resistance value to the first resistance value is less than a ratio of an average line width of the fourth voltage signal line to an average line width of the third voltage signal line.

For example, in the display substrate provided by at least one embodiment of the present disclosure, the display region further comprises a plurality of third gate scanning signal lines respectively connected to threshold compensation sub-circuits of the plurality of rows of pixel units; and the second scanning driving circuit is further connected to the plurality of third gate scanning signal lines through a plurality of third connection wires to respectively provide threshold compensation control signals to the threshold compensation sub-circuits of the plurality of rows of pixel units, and a resistance value of each of the third connection wires is a third resistance value.

For example, in the display substrate provided by at least one embodiment of the present disclosure, the display region further comprises a plurality of fourth gate scanning signal lines respectively connected to data writing sub-circuits of the plurality of rows of pixel units; the peripheral region further comprises a third scanning driving circuit, and the third scanning driving circuit is respectively connected to the plurality of fourth gate scanning signal lines through a plurality of fourth connection wires to respectively provide data writing control signals to the data writing sub-circuits of the plurality of rows of pixel units; the second scanning driving circuit is between the first scanning driving circuit and the third scanning driving circuit relative to the display region; and a resistance value of each of the fourth connection wires is a fourth resistance value, and the fourth resistance value is less than the third resistance value.

For example, in the display substrate provided by at least one embodiment of the present disclosure, the average line width of the first voltage signal line and the average line width of the second voltage signal line satisfy a following relationship: $W_{GNvgh} = W_{Evgh} * (R2/R1 + R3/R1 + a)$, where R1 is the first resistance value, R2 is the second resistance value, R3 is the third resistance value, $W_{GNvgh}$ is the average line width of the second voltage signal line, $W_{Evgh}$ is the average line width of the first voltage signal line, a is a constant, and $0.5 \leq a \leq 7.5$.

For example, in the display substrate provided by at least one embodiment of the present disclosure, the average line width of the first voltage signal line and the average line width of the second voltage signal line satisfy a following relationship: $W_{GNvgh} = W_{Evgh}*(R2/R1+R3/R1+a)$, where R1 is the first resistance value, R2 is the second resistance value, R3 is the third resistance value, $W_{GNvgh}$ is the average line width of the second voltage signal line, $W_{Evgh}$ is the average line width of the first voltage signal line, a is a constant, and $0.6 \leq a \leq 3$.

For example, in the display substrate provided by at least one embodiment of the present disclosure, the average line width of the fourth voltage signal line and the average line width of the third voltage signal line satisfy a following relationship: $W_{GNvgl} = W_{Evgl}*(R2/R1+R3/R1+b)$, where R1 is the first resistance value, R2 is the second resistance value, R3 is the third resistance value, $W_{GNvgl}$ is the average line width of the fourth voltage signal line, $W_{Evgl}$ is the average line width of the third voltage signal line, b is a constant, and $0.3 \leq b \leq 4.5$.

For example, in the display substrate provided by at least one embodiment of the present disclosure, the average line width of the fourth voltage signal line and the average line width of the third voltage signal line satisfy a following relationship: $W_{GNvgl} = W_{Evgl}*(R2/R1+R3/R1+b)$, where R1 is the first resistance value, R2 is the second resistance value, R3 is the third resistance value, $W_{GNvgl}$ is the average line width of the fourth voltage signal line, $W_{Evgl}$ is the average line width of the third voltage signal line, b is a constant, and $1.5 \leq b \leq 3.5$.

For example, in the display substrate provided by at least one embodiment of the present disclosure, the first resistance value, the second resistance value, and the third resistance value satisfy a following relationship: $1.2 \leq R2/R1 \leq 2.5$; and $1.7 \leq (R2+R3)/R1 \leq 3$.

For example, in the display substrate provided by at least one embodiment of the present disclosure, the first resistance value, the second resistance value, and the third resistance value satisfy a following relationship: $1.5 \leq R2/R1 \leq 2.5$; and $2 \leq (R2+R3)/R1 \leq 3$.

For example, in the display substrate provided by at least one embodiment of the present disclosure, the first resistance value and the third resistance value satisfy a following relationship: $R1/R3 = c*(GN(T(out)W/L))/d*EM(T(out)W/L)$, where $GN(T(out)W/L)$ represents a width-to-length ratio of an output transistor comprised in the second scanning driving circuit, and d represents a total number of rows of pixels driven by one first shift register unit comprised in the second scanning driving circuit, $EM(T(out)W/L)$ represents a width-to-length ratio of an output transistor comprised in the first scanning driving circuit, c is a constant, and $0.5 \leq c \leq 1.5$.

For example, in the display substrate provided by at least one embodiment of the present disclosure, the second scanning driving circuit comprises a plurality of cascaded first shift register units; an i-th first shift register unit is connected to an i-th third gate scanning signal line through an i-th third connection wire, and the i-th third gate scanning signal line is connected to threshold compensation sub-circuits of an i-th row of pixel units; and the i-th first shift register unit is further connected to an (i+n)-th second gate scanning signal line through an (i+n)-th second connection wire, the (i+n)-th second gate scanning signal line is connected to first reset sub-circuits of an (i+n)-th row of pixel units, and both i and n are integers greater than 0.

For example, in the display substrate provided by at least one embodiment of the present disclosure, the second scanning driving circuit further comprises n cascaded additional shift register units respectively connected n second gate scanning signal lines respectively corresponding to first n rows of pixel units through n second connection wires to provide the first reset control signals to first reset sub-circuits in the first n rows of pixel units; a j-th additional shift register unit is connected to a j-th second gate scanning signal line through a j-th second connection wire, and the j-th second gate scanning signal line is connected to a j-th row of pixel units; and j is an integer greater than or equal to 1 and less than or equal to n.

For example, in the display substrate provided by at least one embodiment of the present disclosure, the display region comprises a first display sub-region and a second display sub-region, a total number of pixel units in each row in the second display sub-region is equal, and a total number of pixel units in any row in the first display sub-region is less than a total number of pixel units in one row in the second display sub-region.

For example, in the display substrate provided by at least one embodiment of the present disclosure, the first display sub-region comprises a p-th row of pixel units, and the second display sub-region comprises a q-th row of pixel units; a difference value between a resistance value of a first connection wire connected to the p-th row of pixel units and a resistance value of a first connection wire connected to the q-th row of pixel units is a fifth resistance value; a difference value between a resistance value of a third connection wire connected to the p-th row of pixel units and a resistance value of a third connection wire connected to the q-th row of pixel units is a sixth resistance value; a difference value between a resistance value of a fourth connection wire connected to the p-th row of pixel units and a resistance value of a fourth connection wire connected to the q-th row of pixel units is a seventh resistance value; the fifth resistance value, the sixth resistance value and the seventh resistance value all increase with an increase in a total number of pixel units missing from the p-th row of pixel units relative to the q-th row of pixel units; and p is an integer greater than 0, and q is an integer greater than p.

For example, in the display substrate provided by at least one embodiment of the present disclosure, the fifth resistance value, the sixth resistance value and the seventh resistance value satisfy a following relationship: $R5 = Rf + e5*(f_p-1)*g5$, where $\frac{1}{3}W_{pitch} \leq g5 \leq \frac{1}{2}W_{pitch}$, $e5 = k1/(w1*u1)$; $R6 = Rf + e6*(f_p-1)*g6$, where $\frac{1}{3}W_{pitch} \leq g6 \leq \frac{1}{2}W_{pitch}$, $e6 = k2/(w2*u2)$; $R7 = Rf + e7*(f_p-1)*g7$, where $\frac{1}{3}W_{pitch} \leq g7 \leq \frac{1}{2}W_{pitch}$, $e7 = k4/(w4*u4)$; where Rf is a resistance when the total number of pixel units missing from the p-th row of pixel units relative to the q-th row of pixel units is 1; $f_p$ is the total number of pixel units missing from the p-th row of pixel units relative to the q-th row of pixel units; e5, e6 and e7 are constants; k1, k2 and k4 are respectively a resistivity of the first connection wire connected to the p-th row of pixel units, a resistivity of the third connection wire connected to the p-th row of pixel units, and a resistivity of the fourth connection wire connected to the p-th row of pixel units; w1, w2 and w4 are respectively an average line width of the first connection wire connected to the p-th row of pixel units, an average line width of the third connection wire connected to the p-th row of pixel units, and an average line width of the fourth connection wire connected to the p-th row of pixel units; u1, u2, and u4 are respectively an average thickness of the first connecting wire connected to the p-th row of pixel units, an average thickness of the third connection wire connected to the p-th row of pixel units, and an average thickness of the fourth connection wire connected to the p-th row of pixel units; g5, g6 and g7 are constants; and $W_{pitch}$ is a dimension of one pixel unit in a first direction.

For example, in the display substrate provided by at least one embodiment of the present disclosure, the peripheral region comprises a third scanning driving circuit, and the third scanning driving circuit is configured to provide data writing control signals to data writing sub-circuits of the plurality of rows of pixel units; the first connection wire comprises at least two first transfer electrodes and a plurality of first connection electrodes, the at least two first transfer electrodes and the plurality of first connection electrodes are in different layers, the plurality of first connection electrodes are respectively connected to the at least two first transfer electrodes through via holes penetrating through an insulation layer to form the first connection wire, and a resistivity of each of the at least two first transfer electrodes is less than a resistivity of each of the plurality of first connection electrodes; the third connection wire comprises at least one second transfer electrode and a plurality of second connection electrodes, the at least one second transfer electrode and the plurality of second connection electrodes are in different layers, the plurality of second connection electrodes are respectively connected to the at least one second transfer electrode through via holes penetrating through an insulation layer to form the third connection wire, and a resistivity of each of the at least one second transfer electrode is less than a resistivity of each of the plurality of second connection electrodes; and a total number of the at least two first transfer electrodes is greater than a total number of the at least one second transfer electrode.

For example, in the display substrate provided by at least one embodiment of the present disclosure, a distance between two adjacent first transfer electrodes satisfies a following relationship: $1.5W_{pitch} \leq D_{t1} \leq W_{Gn} + W_{Gp}$, where $D_{t1}$ is the distance between two adjacent first transfer electrodes, $W_{pitch}$ is a dimension of one pixel unit in a first direction, $W_{Gn}$ is a dimension of the second scanning driving circuit in the first direction, and $W_{Gp}$ is a dimension of the third scanning driving circuit in the first direction.

For example, in the display substrate provided by at least one embodiment of the present disclosure, a distance between two connection terminals of each first transfer electrode satisfies: $L_{t1} = W_{EM} * s_1$, where $L_{t1}$ is the distance between the two connection terminals of each first transfer electrode, $W_{EM}$ is a dimension of the first scanning driving circuit in a first direction, $s_1$ is a constant, and $1/9 \leq s_1 \leq 1/5$; a distance between two connection terminals of each second transfer electrode satisfies: $L_{t2} = W_{GN} * s_2$, where $L_{t2}$ is the distance between the two connection terminals of each second transfer electrode, $W_{GN}$ is a dimension of the second scanning driving circuit in the first direction, $s_2$ is a constant, and $1/11 \leq s_2 \leq 1/9$.

For example, in the display substrate provided by at least one embodiment of the present disclosure, the second connection wire comprises at least one third transfer electrode extending along a second direction different from a first direction and a plurality of third connection electrodes extending along the second direction, the at least one third transfer electrode and the plurality of third connection electrodes are in different layers, the plurality of third connection electrodes are respectively connected to the at least one third transfer electrode through via holes penetrating through an insulation layer to form the second connection wire, and a resistivity of the third transfer electrode is less than a resistivity of the third connection electrode; a distance between two adjacent third transfer electrodes satisfies: $1.3W_{pitch1} \leq D_{t3} \leq 2.5W_{pitch1}$, where $D_{t3}$ is the distance between two adjacent third transfer electrodes, and $W_{pitch1}$ is a dimension of one pixel unit in the second direction.

For example, in the display substrate provided by at least one embodiment of the present disclosure, the first transfer electrode at least partially overlaps with a first signal line of the second scanning driving circuit in a direction perpendicular to the base substrate; and/or the second transfer electrode at least partially overlaps with a second signal line of the third scanning driving circuit in the direction perpendicular to the base substrate.

For example, in the display substrate provided by at least one embodiment of the present disclosure, the peripheral region further comprises a first auxiliary electrode layer, the pixel unit in the display region comprises a light-emitting element, and the light-emitting element comprises a first electrode layer, a second electrode layer on a side of the first electrode layer away from the base substrate, and a light-emitting layer between the first electrode layer and the second electrode layer; the first auxiliary electrode layer is provided in a same layer as the first electrode layer of the light-emitting element comprised in the pixel unit in the display region; the first auxiliary electrode layer is on a side of the first scanning driving circuit away from the base substrate, and the first auxiliary electrode layer is provided with an electrode vent; at least one terminal of the first transfer electrode at least partially overlaps with the electrode vent in a direction perpendicular to the base substrate; and/or at least one terminal of the second transfer electrode at least partially overlaps with the electrode vent in the direction perpendicular to the base substrate.

For example, in the display substrate provided by at least one embodiment of the present disclosure, the second voltage signal line is provided with a signal line vent, and a dimension of the signal line vent satisfies: $H1 = z * W_{pitch}$, where H1 is the dimension of the signal line vent, $W_{pitch}$ is a dimension of one pixel unit in a first direction, z is a constant, and $1/7 \leq z \leq 1/3$.

For example, in the display substrate provided by at least one embodiment of the present disclosure, the second voltage signal line is provided with a signal line vent, and a dimension of the signal line vent satisfies: $1/3 W_{GNvgh} \leq H1 \leq 1/2 W_{GNvgh}$, where H1 is the dimension of the signal line vent, and $W_{GNvgh}$ is an average line width of the second voltage signal line.

For example, in the display substrate provided by at least one embodiment of the present disclosure, each first shift register unit comprises a first switch transistor; a difference value between a distance between two adjacent signal line vents and a channel dimension of the first switch transistor is less than a predetermined threshold, and a connection via hole for the first voltage signal line to the first electrode of the second capacitor is between two adjacent signal line vents or at least partially overlaps with the signal line vent.

For example, in the display substrate provided by at least one embodiment of the present disclosure, the display region further comprises a pixel defining layer, the pixel defining layer comprises an opening, and the opening is configured to define a light-emitting region of a pixel unit of the display region; the peripheral region further comprises an auxiliary insulation layer and a second auxiliary electrode layer, the auxiliary insulation layer is provided in a same layer as the pixel defining layer in the display region, the second auxiliary electrode layer is provided in a same layer as the second electrode layer in the display region, the auxiliary insulation layer is on a side of the first auxiliary electrode layer away from the base substrate, and the second auxiliary electrode layer is on a side of the auxiliary insulation layer away from the base substrate; the auxiliary insulation layer is provided with at least one opening; a dimension of the opening of the auxiliary insulation layer satisfies: $0.65 \leq B/(W_{EM}+W_{GN}+W_{GP}) \leq 0.95$, where B is the dimension of the opening of the auxiliary insulation layer, $W_{EM}$ is a dimension of the first scanning driving circuit in a first direction, $W_{GN}$ is a dimension of the second scanning driving circuit in the first direction, and $W_{GP}$ is a dimension of the third scanning driving circuit in the first direction.

For example, in the display substrate provided by at least one embodiment of the present disclosure, at least one of the first scanning driving circuit, the second scanning driving circuit and the third scanning driving circuit at least partially overlaps with the at least one opening of the auxiliary insulation layer in the direction perpendicular to the base substrate.

For example, in the display substrate provided by at least one embodiment of the present disclosure, in a case where the peripheral region on one side of the display region comprises a plurality of scanning driving circuits, for the plurality of scanning driving circuits, the closer a scanning driving circuit is to the display region, the less number of transfer electrodes provided on a connection wire to which the scanning driving circuit is connected; and the plurality of scanning driving circuits comprise the first scanning driving circuit and the second scanning driving circuit, and the connection wire comprises the first connection wire and the second connection wire.

For example, in the display substrate provided by at least one embodiment of the present disclosure, the display region further comprises a plurality of fifth gate scanning signal lines respectively connected to second reset sub-circuits of the plurality of rows of pixel units; the peripheral region further comprises a fourth scanning driving circuit, and the fourth scanning driving circuit is respectively connected to the plurality of fifth gate scanning signal lines through a plurality of fifth connection wires to respectively provide second reset control signals to the second reset sub-circuits of the plurality of rows of pixel units; the fourth scanning driving circuit is on a side of the third scanning driving circuit away from the display region; and a resistance value of each fifth connection wire is an eighth resistance value, and the eighth resistance value is greater than the third resistance value.

For example, in the display substrate provided by at least one embodiment of the present disclosure, the fourth scanning driving circuit is between the first scanning driving circuit and the third scanning driving circuit; and the eighth resistance value is less than the first resistance value.

For example, in the display substrate provided by at least one embodiment of the present disclosure, the peripheral region further comprises a fifth voltage signal line and a sixth voltage signal line; the fourth scanning driving circuit is connected to the fifth voltage signal line to output a fifth voltage as a first portion of the second reset control signal, and the fourth scanning driving circuit is connected to the sixth voltage signal line to output a sixth voltage as a second portion of the second reset control signal; an average line width of the fifth voltage signal line is larger than the average line width of the first voltage signal line and smaller than the average line width of the third voltage signal line; and an average line width of the sixth voltage signal line is larger than the average line width of the second voltage signal line and smaller than the average line width of the fourth voltage signal line.

For example, in the display substrate provided by at least one embodiment of the present disclosure, the display region further comprises a plurality of sixth gate scanning signal lines respectively connected to light-emitting control sub-circuits of the plurality of rows of pixel units; the peripheral region further comprises a fifth scanning driving circuit, and the fifth scanning driving circuit is respectively connected to the plurality of sixth gate scanning signal lines through a plurality of sixth connection wires to provide light-emitting control signals to the light-emitting control sub-circuits of the plurality of rows of pixel units; the fifth scanning driving circuit is on a side of the third scanning driving circuit away from the display region; and a resistance value of each sixth connection wire is a ninth resistance value, and the ninth resistance value is greater than the third resistance value.

For example, in the display substrate provided by at least one embodiment of the present disclosure, the fifth scanning driving circuit is on a side of the first scanning driving circuit away from the display region; and the ninth resistance value is greater than the first resistance value.

For example, in the display substrate provided by at least one embodiment of the present disclosure, each of the plurality of rows and columns of pixel units comprises a light-emitting element and a pixel circuit that drives the light-emitting element to emit light, and the pixel circuit comprises a driving sub-circuit, the data writing sub-circuit, the threshold compensation sub-circuit, a reset sub-circuit and a light-emitting control sub-circuit; the driving sub-circuit comprises a control terminal, a first terminal and a second terminal, and is configured to control a driving current flowing through the light-emitting element; the data writing sub-circuit is connected to the first terminal of the driving sub-circuit, a data line and the fourth gate scanning signal line, and is configured to write a data signal provided by the data line into the first terminal of the driving sub-circuit in response to the data writing control signal provide by the fourth gate scanning signal line; the threshold compensation sub-circuit is connected to the control terminal and the second terminal of the driving sub-circuit, a first voltage line and the third gate scanning signal line, and is configured to compensate the driving sub-circuit in response to the threshold compensation control signal provided by the third gate scanning signal line and the data signal that is written; the reset sub-circuit comprises the first reset sub-circuit, and the first reset sub-circuit is connected to the second terminal of the driving sub-circuit, an initial signal line and the second gate scanning signal line, and is configured to apply an initial voltage provided by the initial signal line to the second terminal of the driving sub-circuit in response to the first reset control signal provided by the second gate scanning signal line; and the light-emitting control sub-circuit comprises a first light-emitting control sub-circuit, and the first light-emitting control sub-circuit is connected to the first voltage line, the first terminal of the driving sub-circuit and the first gate scanning signal line, and is configured to apply a first voltage provided by the first voltage line to the first terminal of the driving sub-circuit in response to the light-emitting control signal provided by the first gate scanning signal line.

For example, in the display substrate provided by at least one embodiment of the present disclosure, the reset sub-circuit further comprises a second reset sub-circuit, the plurality of fourth gate scanning signal lines are respectively connected to the second reset sub-circuits of the plurality of rows of pixel units, and the third scanning driving circuit respectively provides second reset control signals to the second reset sub-circuits of the plurality of rows of pixel units through the plurality of fourth gate scanning signal lines; the second reset sub-circuit is connected to the initial signal line, the fourth gate scanning signal line and a first terminal of the light-emitting element, and is configured to apply the initial voltage provided by the initial signal line to the first terminal of the light-emitting element in response to the second reset control signal provided by the fourth gate scanning signal line; and the light-emitting control sub-circuit further comprises a second light-emitting control sub-circuit, and the second light-emitting control sub-circuit is connected to the second terminal of the driving sub-circuit, the first terminal of the light-emitting element and the first gate scanning signal line, and is configured to apply the driving current to the first terminal of the light-emitting element in response to the light-emitting control signal provided by the first gate scanning signal line.

At least one embodiment of the present disclosure also provides a display panel, comprising the display substrate described in any one of the above embodiments.

BRIEF DESCRIPTION OF DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

Figure 1:
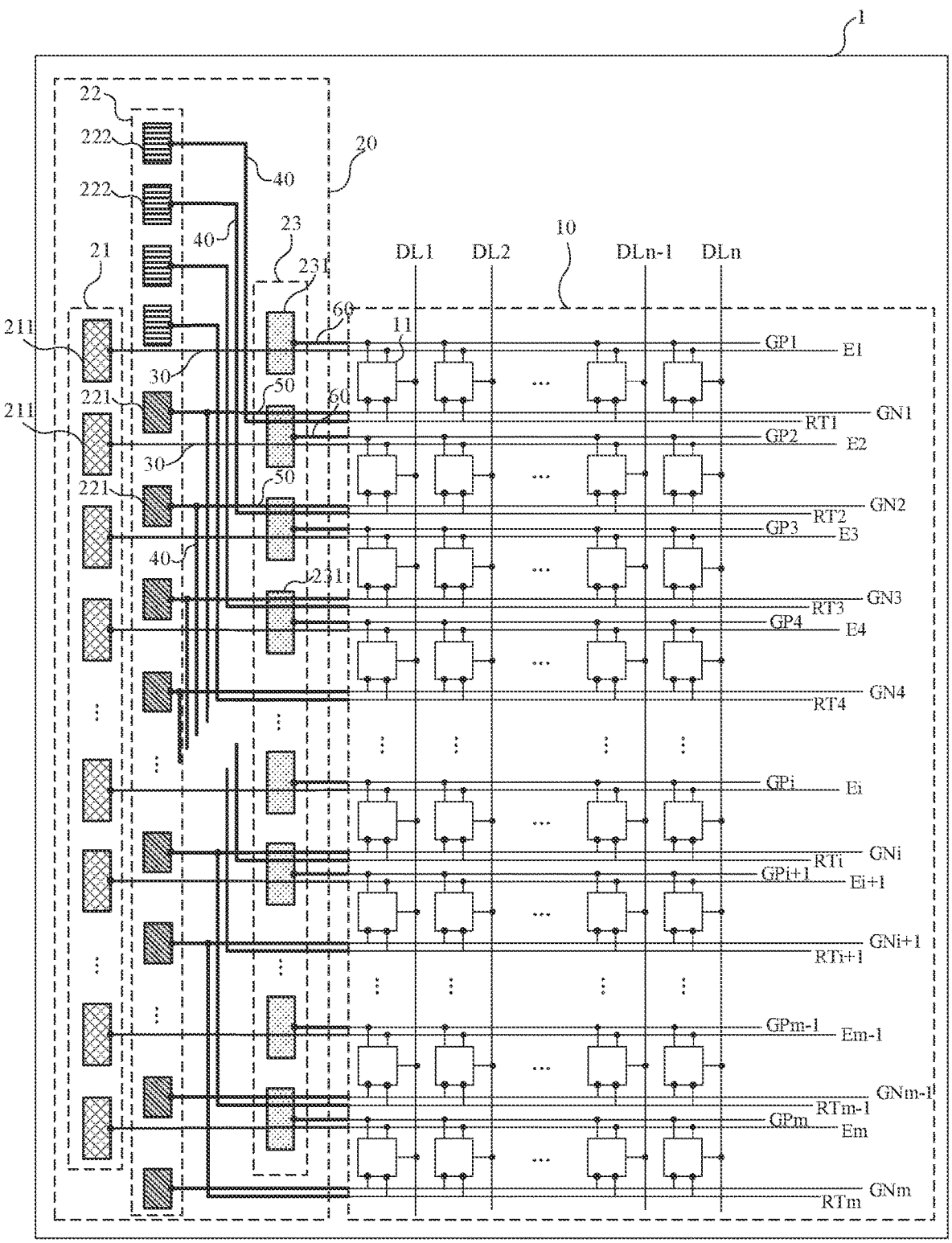
FIG. 1 is a schematic plan view of a display substrate provided by at least one embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Likewise, the terms such as "a," "an," or "the" do not indicate a limitation of amount, but rather indicate the presence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

The present disclosure is described below through several specific embodiments. To keep the following description of the embodiments of the present disclosure clear and concise, detailed descriptions of known functions and known components may be omitted. When any component of an embodiment of the present disclosure appears in more than one drawing, the component is represented by the same reference numeral in each drawing.

A display substrate includes a display region and a peripheral region, the display region includes pixel units arranged in an array, and the peripheral region may be on at least one side of the display region. One or more (two or more) GOAs may be provided in the peripheral region on one side of the display region, and in the case where a plurality of GOAs are provided in the peripheral region, the distances between the GOAs at different locations and the display region are different, and thus the lengths of wires from output terminals of the GOAs at different locations to the display region are different, which results in different resistances on the wires from the output terminals of the GOAs at different locations to the display region. The resistance of the wire affects the delay time of the output signal of the GOA, so the delay times of the output signals of the GOA at different locations are different.

At least one embodiment of the present disclosure provides a display substrate, which includes a display substrate, and the base substrate includes a display region and a peripheral region on at least one side of the display region; the display region includes a plurality of rows and columns of pixel units arranged in an array, a plurality of first gate scanning signal lines respectively connected to light-emitting control sub-circuits of a plurality of rows of pixel units in the plurality of rows and columns of pixel units, and a plurality of second gate scanning signal lines respectively connected to first reset sub-circuits of the plurality of rows of pixel units; the peripheral region includes: a first scanning driving circuit, respectively connected to the plurality of first gate scanning signal lines through a plurality of first connection wires to respectively provide light-emitting control signals to the light-emitting control sub-circuits of the plurality of rows of pixel units, in which a resistance value of each of the first connection wires is a first resistance value; a second scanning driving circuit, on a side of the first scanning driving circuit close to the display region, and respectively connected to the plurality of second gate scanning signal lines through a plurality of second connection wires to respectively provide first reset control signals to the first reset sub-circuits of the plurality of rows of pixel units, in which a resistance value of each of the second connection wires is a second resistance value; a first voltage signal line, configured to provide a first voltage; and a second voltage signal line, configured to provide a second voltage; the first scanning driving circuit is connected to the first voltage signal line to output the first voltage as a first portion of the light-emitting control signal, the second scanning driving circuit is connected to the second voltage signal line to output the second voltage as a first portion of the first reset control signal, and a ratio of the second resistance value to the first resistance value is less than a ratio of an average line width of the second voltage signal line to an average line width of the first voltage signal line.

The display substrate provided by the embodiments of the present disclosure balances the effect of the resistance of the first connection wire and the resistance of the second connection wire on the delay time by adjusting the line width of the first voltage signal line connected to the first scanning driving circuit and the line width of the second voltage signal line connected to the second scanning driving circuit, and thereby reduces the difference in the signal delay time due to the difference in the resistances of the first connection wire and the second connection wire.

The embodiments of the present disclosure and some examples thereof will be described in detail below with reference to the drawings.

FIG. 1 is a schematic plan view of a display substrate provided by at least one embodiment of the present disclosure. For example, as illustrated in FIG. 1, a display substrate 1 includes a display region 10 (i.e., a pixel array region) and a peripheral region 20 on at least one side of the display region 10, and the display region 10 includes a plurality of rows and columns of pixel units 11 arranged in an array, a plurality of first gate scanning signal lines (E1, . . . , Ei, . . . , Em (i is an integer greater than or equal to 1, and m is an integer greater than or equal to i)) respectively connected to light-emitting control sub-circuits of a plurality of rows of pixel units 11, a plurality of second gate scanning signal lines (RT1, . . . , RTi, . . . , RTm) respectively connected to first reset sub-circuits of a plurality of rows of pixel units 11, a plurality of third gate scanning signal lines (GN1, . . . , GNi, . . . , GNm) respectively connected to threshold compensation sub-circuits of a plurality of rows of pixel units 11, and a plurality of fourth gate scanning signal lines (GP1, . . . , GPi, . . . , GPm) respectively connected to data writing sub-circuits of a plurality of rows of pixel units 11. For example, each pixel unit 11 may include a pixel circuit with a circuit structure such as 7T1C, 7T2C, 8T2C or 4T1C in the art and a light-emitting element.

For example, the peripheral region 20 includes a first scanning driving circuit 21 and a second scanning driving circuit 22.

For example, the first scanning driving circuit 21 is respectively connected to the plurality of first gate scanning signal lines E1, E2, . . . , Ei, . . . , Em through a plurality of first connection wires 30 to respectively provide light-emitting control signals to the light-emitting control sub-circuits of the plurality of rows of pixel units 11, and the resistance value of each first connection wire 30 is a first resistance value R1. Because the first scanning driving circuit 21 is configured to drive the light-emitting control sub-circuit of the pixel unit 11, the first scanning driving circuit 21 may also be referred to as an EM GOA (light-emitting control gate scanning driving circuit). Each first connection wire 30 and a first gate scanning signal line connected thereto may be integrally formed, and FIG. 1 employs lines of different widths to represent the first connection wire and the first gate scanning signal line in order to distinguish the first connection wire and the first gate scanning signal line. However, in practice, the widths of the first connection wire 30 and the first gate scanning signal line may be the same or different, which is not limited in the present disclosure.

For example, the second scanning driving circuit 22 is on one side of the first scanning driving circuit 21 close to the display region 10, and is respectively connected to the plurality of second gate scanning signal lines RT1, RT2, . . . , RTi, . . . , RTm through a plurality of second connection wires 40 to respectively provide first reset control signals to the first reset sub-circuits of the plurality of rows of pixel units, and the resistance value of each second connection wire 40 is a second resistance value R2. For example, the second scanning driving circuit 22 provides gate scanning driving signals for the N-type transistors in the pixel unit 11, and thus the second scanning driving circuit 22 may also be referred to as GATE GOA N, or GN for short. Each second connection wire 40 and a second gate scanning signal line connected thereto may be integrally formed, and FIG. 1 employs lines of different widths to represent the second connection wire and the second gate scanning signal line in order to distinguish the second connection wire and the second gate scanning signal line. However, in practice, the widths of the second connection wire and the second gate scanning signal line may be the same or different, which is not limited in the present disclosure.

For example, the second scanning driving circuit 22 is further respectively connected to the plurality of third gate scanning signal lines GN1, . . . , GNi, . . . , GNm through a plurality of third connection wires 50 to respectively provide threshold compensation control signals to the threshold compensation sub-circuits of the plurality of rows of pixel units, and the resistance value of each third connection wire 50 is a third resistance value R3. Each third connection wire 50 and a third gate scanning signal line connected thereto may be integrally formed, and FIG. 1 employs lines of different widths to represent the third connection wire 50 and the third gate scanning signal line in order to distinguish the third connection wire 50 and the third gate scanning signal line. However, in practice, the widths of the third connection wire 50 and the third gate scanning signal line may be the same or different, which is not limited in the present disclosure.

For example, the peripheral region 20 further includes a third scanning driving circuit 23, and the third scanning driving circuit 23 is respectively connected to a plurality of fourth gate scanning signal lines GP1, . . . , GPi, . . . , GPm through a plurality of fourth connection wires 60 to respectively provide data writing control signals to the data writing sub-circuits of the plurality of rows of pixel units. The second scanning driving circuit 22 is between the first scanning driving circuit 21 and the third scanning driving circuit 23 relative to the display region 10, that is, the third scanning driving circuit 23 is on a side of the second scanning driving circuit 22 close to the display region 10. The resistance value of each fourth connection wire 60 is a fourth resistance value R4. For example, the third scanning driving circuit 23 provides gate scanning driving signals for the P-type transistors in the pixel unit 11, so the third scanning driving circuit 23 may also be referred to as GATE GOA P. GP for short. Each fourth connection wire 60 and a fourth gate scanning signal line connected thereto may be integrally formed, and FIG. 1 employs lines of different widths to represent the fourth connection wire 60 and the fourth gate scanning signal line in order to distinguish the fourth connection wire 60 and the fourth gate scanning signal line. However, in practice, the widths of the fourth connection wire 60 and the fourth gate scanning signal line may be the same or different, which is not limited in the present disclosure.

As illustrated in FIG. 1, data lines DL1-DLN (N is an integer greater than 1) longitudinally pass through the display region 10 to provide data signals for the pixel units 11 arranged in an array. For example, each pixel unit 11 may include a pixel circuit with a circuit structure such as 7T1C, 7T2C, 8T2C or 4T1C in the art and a light-emitting element, and the pixel circuit 11 operates under the control of a data signal transmitted through a data line and a gate scanning driving signal and a light-emitting control signal transmitted through gate lines to drive the light-emitting element to emit light to thereby achieve an operation such as display. The light-emitting element may be, for example, an organic light-emitting diode (OLED) or a quantum dot light-emitting diode (QLED), and the embodiments of the present disclosure do not limit this.

Figure 2:
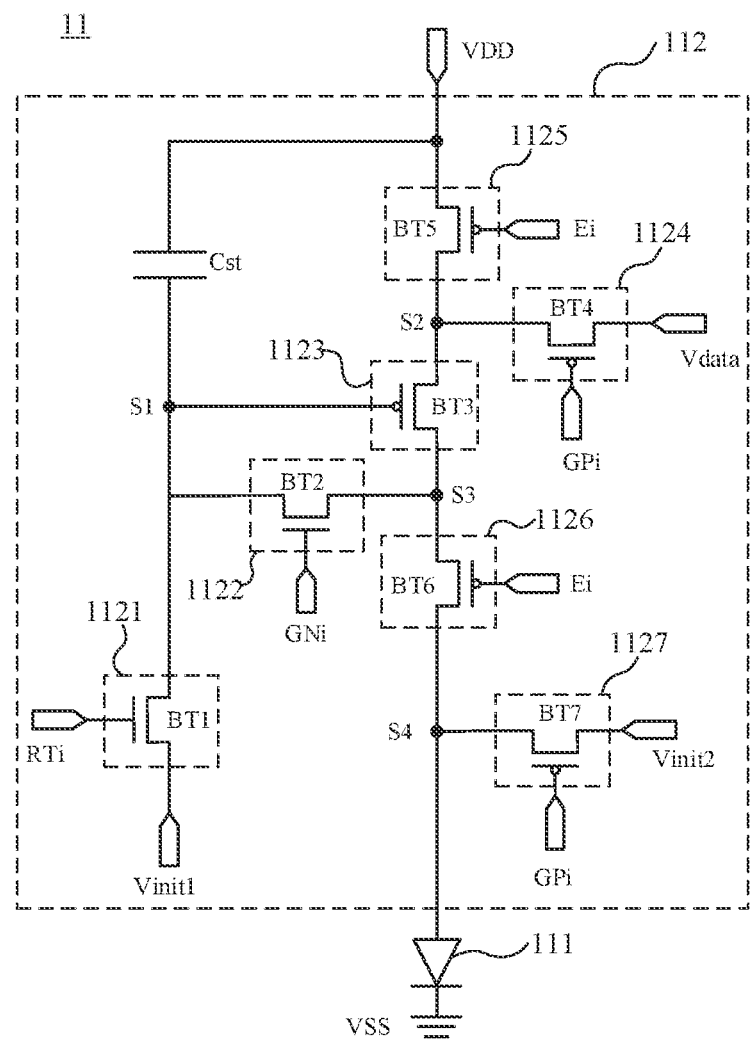
FIG. 2 is a circuit structure diagram of a pixel unit provided by at least one embodiment of the present disclosure.

FIG. 2 is a circuit structure diagram of a pixel unit provided by at least one embodiment of the present disclosure. As illustrated in FIG. 2, each pixel unit 11 of the plurality of rows and columns of pixel units includes a light-emitting element 111 and a pixel circuit 112 that drives the light-emitting element 111 to emit light, and the pixel circuit 112 includes a driving sub-circuit 1123, a data writing sub-circuit 1124, a threshold compensation sub-circuit 1122, a reset sub-circuit, a light-emitting control sub-circuit, and a storage capacitor Cst.

The first reset sub-circuit 1121 includes a first reset transistor BT1, the threshold compensation sub-circuit 1122 includes a threshold compensation transistor BT2, the driving sub-circuit 1123 includes a driving transistor BT3, the data writing sub-circuit 1124 includes a data writing transistor BT4, the first light-emitting control sub-circuit 1125 includes a first light-emitting control transistor BT5, the second light-emitting control sub-circuit 1126 includes a second light-emitting control transistor BT6, and the second reset sub-circuit 1127 includes a second reset transistor BT7. For example, the first reset transistor BT1 and the threshold compensation transistor BT2 are N-type transistors, and the data writing transistor BT4 and the second reset transistor BT7 are P-type transistors. The connection relationship and working principle of the pixel units in the embodiments of the present disclosure are only examples, and the pixel units may adopt other structures as required, which is not limited in the present disclosure.

For example, the driving sub-circuit 1123 includes a control terminal, a first terminal and a second terminal, and is configured to control the driving current flowing through the light-emitting element 111. For example, the control terminal of the driving sub-circuit 1123 is connected to a first node S1, the first terminal is connected to a second node S2, and the second terminal is connected to a third node S3.

For example, as illustrated in FIG. 1 and FIG. 2, the data writing sub-circuit 1124 is connected to the first terminal of the driving sub-circuit 1123, a data line Vdata and a fourth gate scanning signal line GPi (i is an integer greater than or equal to 1 and less than or equal to m) connected, and is configured to write the data signal provided by the data line Vdata into the first terminal of the driving sub-circuit 1123 in response to a data writing control signal provided by the fourth gate scanning signal line GPi.

For example, the threshold compensation sub-circuit 1122 is connected to the control terminal and the second terminal of the driving sub-circuit 1123, a first voltage line VDD and a third gate scanning signal line GNi, and is configured to compensate the driving sub-circuit 1123 in response to the threshold compensation control signal provided by the third gate scanning signal line GNi and the data signal that is written.

For example, the reset sub-circuit includes a first reset sub-circuit 1121, and the first reset sub-circuit 1121 is connected to the control terminal of the driving sub-circuit 1123, an initial signal line Vinit1 and a second gate scanning signal line RTi, and is configured to apply an initial voltage provided by the initial signal line to the second terminal of the driving sub-circuit 1123 in response to the first reset control signal provided by the second gate scanning signal line RTi.

For example, the reset sub-circuit further includes a second reset sub-circuit 1127, the plurality of fourth gate scanning signal lines GPi are respectively connected to the second reset sub-circuits 1127 of the plurality of rows of pixel units, and the third scanning driving circuit 23 respectively provides second reset control signals to the second reset sub-circuits 1127 of the plurality of rows of pixel units. For example, the second reset sub-circuit 1127 is connected to an initial signal line Vinit2, the fourth gate scanning signal line GPi and a first terminal of the light-emitting element 111, and is configured to apply an initial voltage provided by the initial signal line Vinit2 to the first terminal of the light-emitting element 111 in response to the second reset control signal provided by the fourth gate scanning signal line GPi. A second terminal of the light-emitting element 111 is connected to a second voltage line VSS.

For example, the light-emitting control sub-circuit includes a first light-emitting control sub-circuit 1125, and the first light-emitting control sub-circuit 1125 is connected to the first voltage line VDD, the first terminal of the driving sub-circuit 1123, and a first gate scanning signal line Ei, and is configured to apply the first voltage provided by the first voltage line VDD to the first terminal of the driving sub-circuit 1123 in response to a light-emitting control signal provided by the first gate scanning signal line Ei.

For example, the light-emitting control sub-circuit further includes a second light-emitting control sub-circuit 1126, and the second light-emitting control sub-circuit 1126 is connected to the second terminal of the driving sub-circuit 1123, the first terminal of the light-emitting element 111, and the first gate scanning signal line Ei, and is configured to cause the driving current to be applied to the first terminal of the light-emitting element 111 in response to the light-emitting control signal provided by the first gate scanning signal line Ei.

For example, as illustrated in FIG. 1, the first scanning driving circuit 21 includes a plurality of cascaded second shift register units 211 (for example, represented by boxes 211 filled with diamond patterns in a dotted box 21 in FIG. 1), each second shift register unit 211 is configured to drive one or more rows of pixel units 11. The embodiments of the present disclosure are described by taking the case where each second shift register unit 211 is configured to drive one row of pixel units 11 as an example, but the embodiments of the present disclosure are not limited thereto.

For example, the peripheral region further includes a first voltage signal line Evgh (not illustrated in FIG. 1) and a third voltage signal line Evgl (not illustrated in FIG. 1), the first voltage signal line Evgh is configured to provide the first voltage, the third voltage signal line Evgl is configured to provide a third voltage, and the third voltage is less than the first voltage. The first scanning driving circuit 21 is connected with the first voltage signal line Evgh to output the first voltage as a first portion of the light-emitting control signal, for example, the first voltage signal line Evgh is connected to all of the plurality of second shift register units 211 in the first scanning driving circuit 21. The first portion of the light-emitting control signal is, for example, a high-level portion of the light-emitting control signal, for example, the high-level portion of the light-emitting control signal may cause the first light-emitting control transistor BT5 and the second light-emitting control transistor BT6 to be turned off in a non-light-emitting phase. The first scanning driving circuit 21 is further connected to the third voltage signal line Evgl to output the third voltage as a second portion of the light-emitting control signal, for example, the third voltage signal line Evgl is connected to all of the plurality of second shift register units 211 in the first scanning driving circuit 21. The second portion of the light-emitting control signal is, for example, a low-level portion of the light-emitting control signal, for example, the low-level portion of the light-emitting control signal may cause the first light-emitting control transistor BT5 and the second light-emitting control transistor BT6 to be turned on in a light-emitting phase.

Figure 3A:
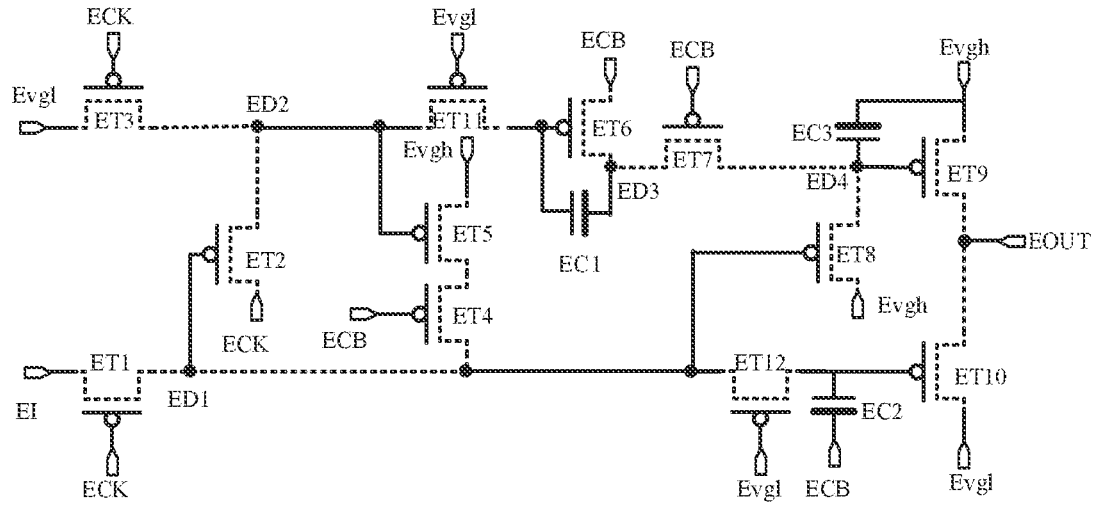
FIG. 3A is a circuit structure diagram of a second shift register unit provided by at least one embodiment of the present disclosure.
Figure 3B:
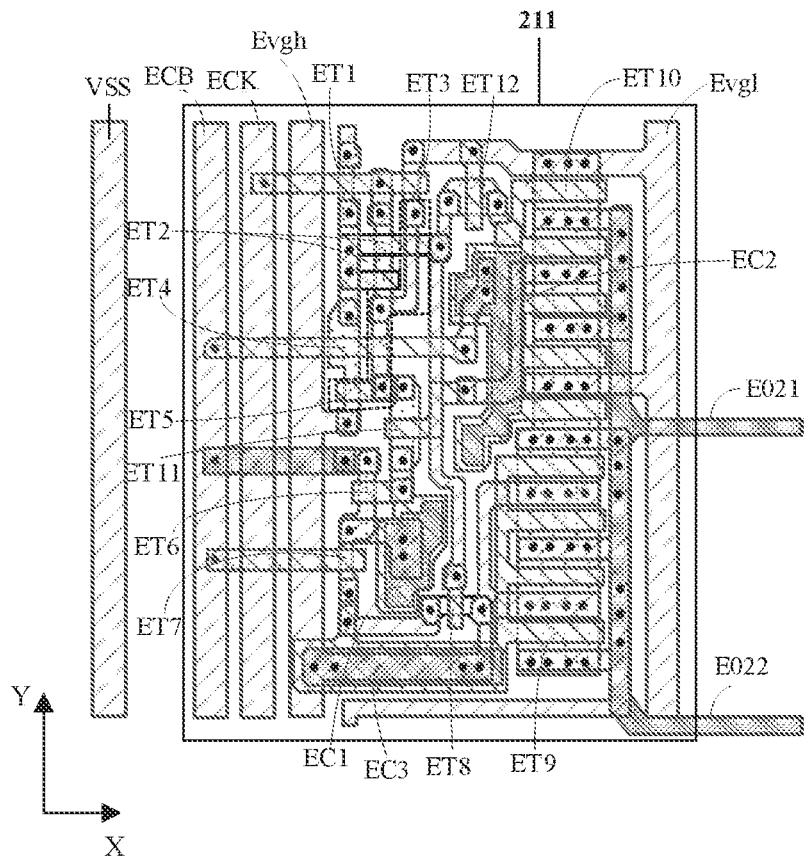
FIG. 3B is a schematic layout diagram of the second shift register unit illustrated in FIG. 3A on the display substrate.

FIG. 3A is a circuit structure diagram of a second shift register unit provided by at least one embodiment of the present disclosure. FIG. 3B is a schematic layout diagram of the second shift register unit illustrated in FIG. 3A on the display substrate. The second shift register unit is briefly introduced below with reference to FIG. 3A and FIG. 3B.

Figure 4A:
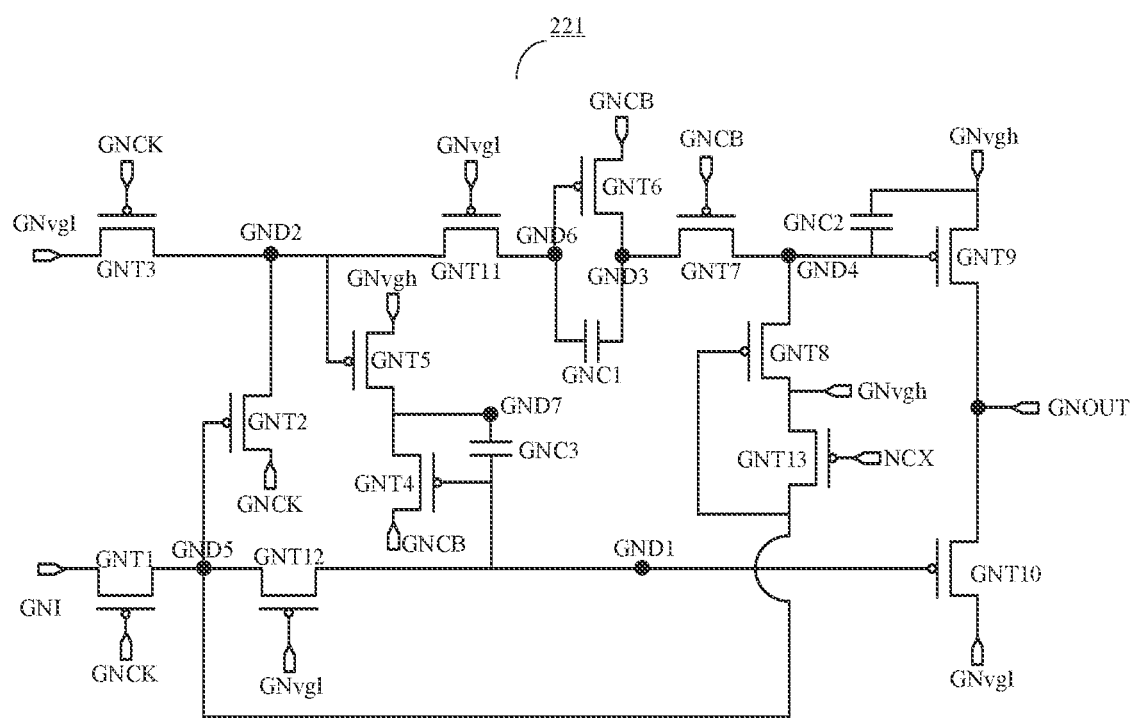
FIG. 4A is a circuit structure diagram of a first shift register unit provided by at least one embodiment of the present disclosure.

As illustrated in FIG. 3A and FIG. 3B, the second shift register unit 211 includes 12 transistors (a first transistor ET1, a second transistor ET2, a third transistor ET3, a fourth transistor ET4, a fifth transistor ET5, a sixth transistor ET6, a seventh transistor ET7, an eighth transistor ET8, a ninth transistor ET9 (may also be referred to as an output transistor), a tenth transistor ET10 (may also be referred to as an output control transistor, or an output transistor, the embodiments of the present disclosure do not limit this), an eleventh transistor ET11 and a twelfth transistor ET12) and three capacitors (a first capacitor EC1, a second capacitor EC2 and a third capacitor EC3). In some embodiments, the second shift register unit 211 may also adopt a circuit structure of 10T3C that does not include the eleventh transistor ET11 and the twelfth transistor ET12. In some other embodiments, the second shift register unit 211 may also adopt a circuit structure of 13T3C as illustrated in FIG. 4A, or a circuit structure of 12T3C that does not include a thirteen transistor GNT13.

For example, in the case where a plurality of second shift register units 211 are cascaded, a second electrode of a first transistor ET1 in a first stage of second shift register unit 211 is connected to an input terminal EI, and the input terminal EI is configured to be connected to a trigger signal line ESTV to receive a trigger signal as an input signal; and a second electrode of a first transistor ET1 in each of the other stages of second shift register units 211 is electrically connected to an output terminal of a previous stage of second shift register unit 211 to receive an output signal output from an output terminal EOUT (for example, an output terminal E021 and an output terminal E022) of the previous stage of second shift register unit 211 as an input signal, thereby achieving a shift output to provide light-emitting control signals, such as shifted row by row, to the pixel units 11 arranged in an array in the display region 10 of the display panel. For example, the following description will be made by taking the ninth transistor ET9 as an output transistor as an example.

In addition, as illustrated in FIG. 3A and FIG. 3B, the second shift register unit 211 further includes a first clock signal terminal ECK and a second clock signal terminal ECB, where ECK also represents the first clock signal line, and ECB also represents the second clock signal line. For example, the first clock signal and the second clock signal may be pulse signals with a duty cycle greater than 50%, and the difference between the two is, for example, half a cycle.

For example, Evgh represents the first voltage signal line and the first voltage provided by the first voltage signal line, Evgl represents the third voltage signal line and the third voltage provided by the third voltage signal line, and the third voltage is less than the first voltage. For example, the first voltage is of a DC high level, and the third voltage is of a DC low level.

As illustrated in FIG. 3A and FIG. 3B, a gate electrode of the first transistor ET1 is connected to the first clock signal terminal ECK (the first clock signal terminal is connected to the first clock signal line ECK) to receive the first clock signal, a second electrode of the first transistor ET1 is connected to the input terminal EI, and a first electrode of the first transistor ET1 is connected to a first node ED1. For example, in the case where the second shift register unit is the first stage of second shift register unit, the input terminal EI is connected to the trigger signal line ESTV to receive the trigger signal; and in the case where the second shift register unit is one of other stages of second shift register units except the first stage of second shift register unit, the input terminal EI is connected to the output terminal EOUT of the previous stage of second shift register unit.

A gate electrode of the second transistor ET2 is connected to the first node ED1, a first electrode of the second transistor ET2 is connected to a second node ED2, and a second electrode of the second transistor ET2 is connected to the first clock signal terminal ECK to receive the first clock signal.

A gate electrode of the third transistor ET3 is connected to the first clock signal terminal ECK to receive the first clock signal, a first electrode of the third transistor ET3 is connected to the second node ED2, and a second electrode of the third transistor ET3 is connected to the third voltage signal line Evgl to receive the third voltage.

A gate electrode of the fourth transistor ET4 is connected to the second clock signal terminal ECB (for example, the second clock signal terminal ECB is connected to the second clock signal line ECB) to receive the second clock signal, a first electrode of the fourth transistor ET4 is connected to the first node ED1, and a second electrode of the fourth transistor ET4 is connected to a second electrode of the fifth transistor ET5.

A gate electrode of the fifth transistor ET5 is connected to the second node ED2, and a first electrode of the fifth transistor ET5 is connected to the first voltage signal line Evgh to receive the first voltage.

A gate electrode of the sixth transistor ET6 is connected to a second electrode of the eleventh transistor ET11, a first electrode of the sixth transistor ET6 is connected to the second clock signal terminal ECB to receive the second clock signal, and a second electrode of the sixth transistor ET6 is connected to a third node ED3.

A first electrode of the first capacitor EC1 is connected to the second electrode of the eleventh transistor ET11, and a second electrode of the first capacitor EC2 is connected to the third node ED3.

A gate electrode of the seventh transistor ET7 is connected to the second clock signal terminal ECB to receive the second clock signal, a first electrode of the seventh transistor ET7 is connected to the third node ED3, and a second electrode of the seventh transistor ET7 is connected to a fourth node ED4.

A gate electrode of the eighth transistor ET8 is connected to the first node ED1, a first electrode of the eighth transistor ET8 is connected to the fourth node ED4, and a second electrode of the eighth transistor ET8 is connected to the first voltage signal line Evgh to receive the first voltage.

A gate electrode of the output transistor ET9 is connected to the fourth node ED4, a first electrode of the output transistor ET9 is connected to the first voltage signal line Evgh to receive the first voltage, and a second electrode of the output transistor ET9 is connected to the output terminal EOUT.

A first electrode of the third capacitor EC3 is connected to the fourth node ED4, and a second electrode of the third capacitor EC3 is connected to the first voltage signal line Evgh to receive the third voltage.

A gate electrode of the tenth transistor ET10 is connected to a second electrode of the twelfth transistor ET12, a first electrode of the tenth transistor ET10 is connected to the third voltage signal line Evgl to receive the third voltage, and a second electrode of the tenth transistor ET10 is connected to the output terminal EOUT.

A first electrode of the second capacitor EC2 is connected to the second electrode of the twelfth transistor ET12, and a second electrode of the second capacitor EC2 is connected to the second clock signal terminal ECB to receive the second clock signal.

A gate electrode of the eleventh transistor ET11 is connected to the third voltage signal line Evgl to receive the third voltage, and a first electrode of the eleventh transistor ET11 is connected to the second node ED2.

A gate electrode of the twelfth transistor ET12 is connected to the third voltage signal line Evgl to receive the third voltage, and a first electrode of the twelfth transistor ET12 is connected to the first node ED1.

It should be noted that the working principle of the second shift register unit may refer to the introduction in the art, and details are not repeated herein.

As illustrated in FIG. 3B, the signal lines ECB, ECK, Evgl, and Evgh may be arranged along a first direction (for example, the X-axis direction), and all extend along a second direction (for example, the Y-axis direction).

The transistors in the second shift register unit 211 illustrated in FIG. 3A are all described by taking P-type transistors as an example, that is, each transistor is turned on when the gate electrode is connected to a low level (a turn-on level), and turned off when connected to a high level (a turn-off level). In this case, the first electrode of the transistor may be a source electrode, and the second electrode of the transistor may be a drain electrode.

The second shift register unit includes, but is not limited to, the configuration illustrated in FIG. 3A, for example, the second shift register unit 211 may not include ET11 and ET12, or transistors with similar functions as ET11 or ET12 may be provided at positions of the nodes ED3 or ED4, and the respective transistors may also adopt N-type transistors or a mixture of P-type transistors and N-type transistors, simply by simultaneously connecting terminal polarities of a selected type of transistor in accordance with terminal polarities of a corresponding transistor in the embodiments of the present disclosure. The layout illustrated in FIG. 3B is only an example, and the layout of the second shift register unit on the display substrate may be determined according to actual requirements, which is not limited by the embodiments of the present disclosure.

For example, as illustrated in FIG. 1, the second scanning driving circuit 22 includes m cascaded first shift register units 221 (for example, represented by a box 221 filled with a lower diagonal line in the dotted box 22 of FIG. 1) and n cascaded additional shift register units 222 (for example, represented by a box 222 filled with a horizontal line in the dotted box 22 of FIG. 1), for example, m is an integer greater than 1, n is an integer greater than 0, m is greater than n, and n is, for example, an integer greater than or equal to 1 and less than or equal to 10. Each first shift register unit 221 is configured to drive one or more rows of pixel units 11, and each additional shift register unit 222 is configured to drive one or more rows of pixel units 11. The embodiments of the present disclosure take the case where each first shift register unit 221 is configured to drive one row of pixel units 11, and each additional shift register unit 222 is configured to drive one row of pixel units 11 as an example for illustration, but the embodiments of the present disclosure are not limited thereto. The n additional shift register units 222 are cascaded with the m first shift register units 221.

For example, n additional shift register units 222 are respectively connected to n second gate scanning signal lines RT1~RTn respectively corresponding to first n rows of pixel units through n second connection wires 40 to provide first reset control signals to first reset sub-circuits in the first n rows of pixel units. A j-th additional shift register unit 222 is connected to a j-th second gate scanning signal line RTj through a j-th second connection wire 40, the j-th second gate scanning signal line RTj is connected to a j-th row of pixel units, and j is an integer greater than or equal to 1 and less than or equal to n.

For example, in some examples, the second scanning driving circuit 22 may include four additional shift register units 222, and the four additional shift register units 222 (Dummy GOA N. DGN for short) are respectively connected to second gate scanning signal lines RT1-RT4 of the first four rows of pixel units through four second connection wires 40, and then connected to first reset sub-circuits (or first reset transistors BT1) of the first four rows of pixel units. That is, the first additional shift register unit 222 is connected to a second gate scanning signal line RT1 of the first row of pixel units through one second connection wire 40, and then connected to first reset sub-circuits of the first row of pixel units to provide first reset control signals to the first reset sub-circuits. The second additional shift register unit 222, the third additional shift register unit 222, etc., are the same as above.

It should be noted that the embodiments of the present disclosure are related to the cascaded relationship of the first shift register units, and are not limited to four additional shift register units, as the case may be, and the embodiments of the present disclosure are not limited thereto.

For example, a plurality (m-n) of first shift register units 221 provided after n additional shift register units 222 are respectively connected to the (n+1)-th second gate scanning signal line to the m-th second gate scanning signal line (RTn+1-RTm) through a plurality (m-n) of second connection wires 40, and m first shift register units 221 are respectively connected to the first third gate scanning signal line to the m-th third gate scanning signal line (GN1-GNm) through m third connection wires 50.

For example, the i-th first shift register unit 221 is connected to the i-th third gate scanning signal line GNi through the i-th third connection wire 50, and the i-th third gate scanning signal line GNi is connected to threshold compensation sub-circuits of the i-th row of pixel units. The i-th first shift register unit is further connected to the (i+n)-th second gate scanning signal line RTi+n through the (i+n)-th second connection wire 40, the (i+n)-th second gate scanning signal line RTi+n is connected to first reset sub-circuits of the (i+n)-th row of pixel units, and both i and n are integers greater than 0.

For example, in the case where the second scanning driving circuit 22 includes four additional shift register units 222 (that is, n is equal to 4), the first first shift register unit 221 is connected to the first third gate scanning signal line GN1 through one third connection wire 50, and then connected to threshold compensation sub-circuits of the first row of pixel units. Moreover, the first first shift register unit 221 can be connected to the fifth second gate scanning signal line RT5 through one second connection wire 40, and then connected to first reset sub-circuits of the fifth row of pixel units. Both the second connection wire 40 and the third connection wire 50 are connected to the output terminal of the first shift register unit 221. Other first shift register units 221 are the same as above. Based on this method, the output signal of each first shift register unit 221 can drive one or more rows of pixel units behind to reset and simultaneously drive the same row of pixel units to perform threshold compensation.

For example, the peripheral region further includes a second voltage signal line GNvgh (not illustrated in FIG. 1) and a fourth voltage signal line GNvgl (not illustrated in FIG. 1), the second voltage signal line GNvgh is configured to provide a second voltage, the fourth voltage signal line GNvgl is configured to provide a fourth voltage, and the fourth voltage is less than the second voltage. The second scanning driving circuit 22 is connected to the second voltage signal line GNvgh to output the second voltage as a first portion of the first reset control signal, for example, the second voltage signal line GNvgh is connected to all of the plurality of first shift register units 221 in the second scanning driving circuit 22. The first portion of the first reset control signal is, for example, a high-level portion of the first reset control signal, for example, the high-level portion of the first reset control signal may cause the first reset transistor BT1 to be turned on in a reset phase. The second scanning driving circuit 22 is further connected to the fourth voltage signal line GNvgl to output the fourth voltage as a second portion of the first reset control signal, for example, the fourth voltage signal line GNvgl is connected to all of the plurality of first shift register units 221 in the second scanning driving circuit 22. The second portion of the first reset control signal is, for example, a low-level portion of the first reset control signal, for example, the low-level portion of the first reset control signal may cause the first reset transistor BT1 to be turned off in a non-reset phase.

Figure 4B:
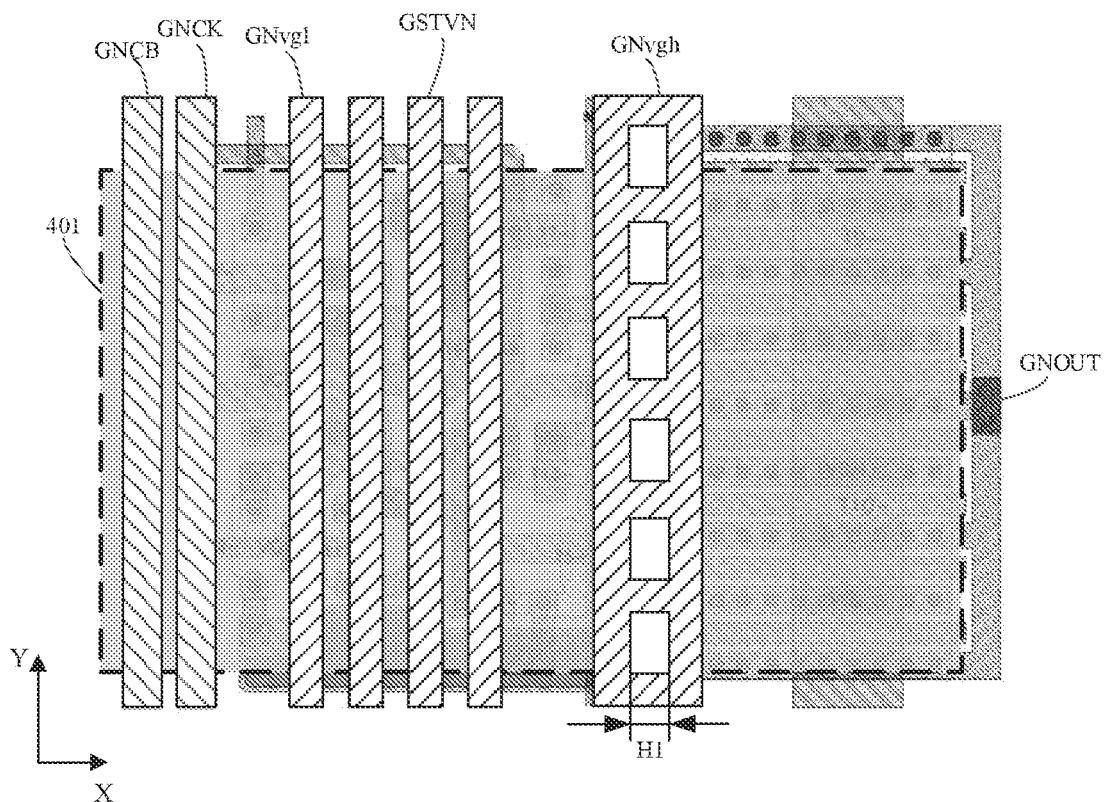
FIG. 4B is a schematic diagram of some signal lines in the layout of the first shift register unit illustrated in FIG. 4A on the display substrate.

FIG. 4A is a circuit structure diagram of a first shift register unit provided by at least one embodiment of the present disclosure. FIG. 4B is a schematic diagram of some signal lines in the layout of the first shift register unit illustrated in FIG. 4A on the display substrate. The first shift register unit is briefly introduced below with reference to FIG. 4A and FIG. 4B.

As illustrated in FIG. 4A and FIG. 4B, the first shift register unit 221 includes 13 transistors (a first transistor GNT1, a second transistor GNT2, a third transistor GNT3, a fourth transistor GNT4, a fifth transistor GNT5, a sixth transistor GNT6, a seventh transistor GNT7, an eighth transistor GNT8, a ninth transistor GNT9 (may also be referred to as an output transistor), a tenth transistor GNT10 (may also be referred to as an output transistor), an eleventh transistor GNT11, a twelfth transistor GNT12 and a thirteenth transistor GNT13), and three capacitors (a first capacitor GNC1, a second capacitor GNC2 and a third capacitor GNC3). For example, in the case where a plurality of first shift register units 221 are cascaded, a second electrode of a first transistor GNT1 in a first stage of first shift register unit 221 is connected to an input terminal GNI, the input terminal GNI is configured to be connected to a trigger signal line STV to receive a trigger signal as an input signal, and the trigger signal line STV is a signal line GSTVN. A second electrode of a first transistor GNT1 in each of the other stages of first shift register units 221 is electrically connected to an output terminal of a previous stage of first shift register unit 221 to receive an output signal output from an output terminal EOUT of the previous stage of first shift register unit 221 as an input signal, thereby achieving a shift output to provide light-emitting control signals, such as shifted row by row, to the pixel units 11 arranged in an array in the display region 10 of the display panel.

In some embodiments, the first shift register unit 221 may include 12 transistors, not excluding the aforementioned thirteenth transistor GNT13. In some other embodiments, the first shift register unit 221 may also be a 12T3C/10T3C circuit as illustrated in FIG. 3A.

In addition, as illustrated in FIG. 4A and FIG. 4B, the first shift register unit 221 also includes a first clock signal terminal GNCK and a second clock signal terminal GNCB, GNCK also represents the first clock signal line, and GNCB also represents the second clock signal line.

For example, GNvgh represents a second voltage signal line and a second voltage provided by the second voltage signal line, GNvgl represents a fourth voltage signal line and a fourth voltage provided by the fourth voltage signal line, and the fourth voltage is less than the second voltage. For example, the second voltage is a DC high level, and the fourth voltage is a DC low level.

As illustrated in FIG. 4A and FIG. 4B, a gate electrode of the first transistor GNT1 is connected to the first clock signal terminal GNCK (the first clock signal terminal is connected to the first clock signal line GNCK) to receive the first clock signal, a second electrode of the first transistor GNT1 is connected to the input terminal GNI, and a first electrode of the first transistor GNT1 is connected to a fifth node GND5. For example, in the case where the first shift register unit is the first stage of first shift register unit, the input terminal GN is connected to the trigger signal line GSTVN to receive the trigger signal; and in the case where the first shift register unit is one of other stages of first shift register units except the first stage of first shift register unit, the input terminal GNI is connected to the output terminal EOUT of the previous stage of first shift register unit.

A gate electrode of the second transistor GNT2 is connected to the fifth node GND5, a first electrode of the second transistor T2 is connected to a second node GND2, and a second electrode of the second transistor GNT2 is connected to the first clock signal terminal GNCK to receive the first clock signal.

A gate electrode of the third transistor GNT3 is connected to the first clock signal terminal GNCK to receive the first clock signal, a first electrode of the third transistor GNT3 is connected to the second node GND2, and a second electrode of the third transistor GNT3 is connected to the fourth voltage signal line GNvgl to receive the fourth voltage.

A gate electrode of the fourth transistor GNT4 is connected to a first node GND1, a first electrode of the fourth transistor GNT4 is connected to the second clock signal terminal GNCB (for example, the second clock signal terminal GNCB is connected to the second clock signal line GNCB) to receive the second clock signal, a second electrode of the fourth transistor GNT4 is connected to a seventh node GND7, and the second electrode of the fourth transistor GNT4 is further connected to a second electrode of the fifth transistor GNT5.

A gate electrode of the fifth transistor GNT5 is connected to the second node GND2, and a first electrode of the fifth transistor GNT5 is connected to the second voltage signal line GNvgh to receive the second voltage.

A gate electrode of the sixth transistor GNT6 is connected to a sixth node GND6, a first electrode of the sixth transistor GNT6 is connected to a third node GND3, a second electrode of the sixth transistor GNT6 is connected to the second clock signal terminal GNCB to receive the second clock signal, and the first electrode of the sixth transistor GNT6 is further connected to a first electrode of the seventh transistor GNT7.

A gate electrode of the seventh transistor GNT7 is connected to the second clock signal terminal GNCB to receive the second clock signal, the first electrode of the seventh transistor GNT7 is connected to the third node GND3, and a second electrode of the seventh transistor GNT7 is connected to a fourth node GND4.

A gate electrode of the eighth transistor GNT8 is connected to the first node GND1, a first electrode of the eighth transistor GNT8 is connected to the fourth node GND4, and a second electrode of the eighth transistor GNT8 is connected to the second voltage signal line GNvgh to receive the second voltage.

A gate electrode of the ninth transistor GNT9 is connected to the fourth node GND4, a first electrode of the ninth transistor GNT9 is connected to the second voltage signal line GNvgh to receive the second voltage, and a second electrode of the ninth transistor GNT9 is connected to an output terminal GNOUT.

A gate electrode of the tenth transistor GNT10 is connected to the first node GND1, a first electrode of the tenth transistor GNT10 is connected to the fourth voltage signal line GNvgl to receive the fourth voltage, and a second electrode of the tenth transistor GNT10 is connected to the output terminal GNOUT.

A gate electrode of the eleventh transistor GNT11 is connected to the fourth voltage signal line GNvgl to receive the fourth voltage, a first electrode of the eleventh transistor GNT11 is connected to the second node GND2, and a second electrode of the eleventh transistor GNT11 is connected to the sixth node GND6.

A gate electrode of the twelfth transistor GNT12 is connected to the fourth voltage signal line GNvgl to receive the fourth voltage, a first electrode of the twelfth transistor GNT12 is connected to the fifth node GND5, and a second electrode of the twelfth transistor GNT12 is connected to the first Node GND1.

A gate electrode of the thirteenth transistor GNT13 is connected to a signal line NCX, a first electrode of the thirteenth transistor GNT13 is connected to the second voltage signal line GNvgh to receive the second voltage, and a second electrode of the thirteenth transistor GNT13 is connected to the first node GND1.

A first electrode of the first capacitor GNC1 is connected to the sixth node GND6, and a second electrode of the first capacitor GNC2 is connected to the third node GND3.

A first electrode of the second capacitor GNC2 is connected to the fourth node GND4, and a second electrode of the second capacitor GNC2 is connected to the second voltage signal line GNvgh to receive the second voltage.

A first electrode of the third capacitor GNC3 is connected to the first node GND1, and a second electrode of the third capacitor GNC3 is connected to the seventh node GND7.

It should be noted that the working principle of the first shift register unit may refer to the introduction in the art, and details are not repeated herein.

As illustrated in FIG. 4B, the signal lines GNCB, GNCK, GNvl, GSTVN, and GNvgh may all extend along the second direction (Y-axis direction) and be arranged along the first direction (X-axis direction). Respective transistors (GNT1-GNT13) and respective capacitors (GNC-GNC3) may be formed in a region 401, the specific layout of respective transistors and capacitors on the display substrate may be determined according to the requirements, an existing layout in the art may be adopted, and the embodiments of the present disclosure do not limit this.

The first shift register unit includes, but is not limited to, the configuration illustrated in FIG. 4A, and the respective transistors may adopt P-type transistors, N-type transistors, or a mixture of P-type transistors and N-type transistors, simply by simultaneously connecting terminal polarities of a selected type of transistor in accordance with terminal polarities of a corresponding transistor in the embodiments of the present disclosure.

For example, as illustrated in FIG. 1, the third scanning driving circuit 23 includes a plurality of cascaded third shift register units 231 (for example, represented by a box 231 filled with small black dots in the dotted box 23 of FIG. 1), and each third shift register unit 231 is configured to drive one or more rows of pixel units 11. The embodiments of the present disclosure take the case where each third shift register unit 231 is configured to drive one row of pixel units 11 as an example for illustration, but the embodiments of the present disclosure are not limited thereto.

For example, the peripheral region further includes a fifth voltage signal line GPvgh and a sixth voltage signal line GPvgl (not illustrated in FIG. 1) connected to the third scanning driving circuit 23, the fifth voltage signal line GPvgh is configured to provide a high-level voltage, and the sixth voltage signal line GPvgl is configured to provide a low-level voltage.

Figure 5A:
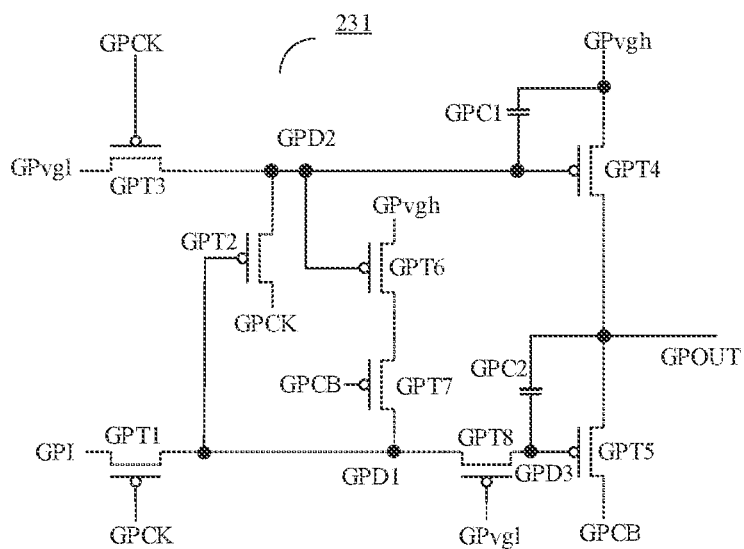
FIG. 5A is a circuit structure diagram of a third shift register unit provided by at least one embodiment of the present disclosure.
Figure 5B:
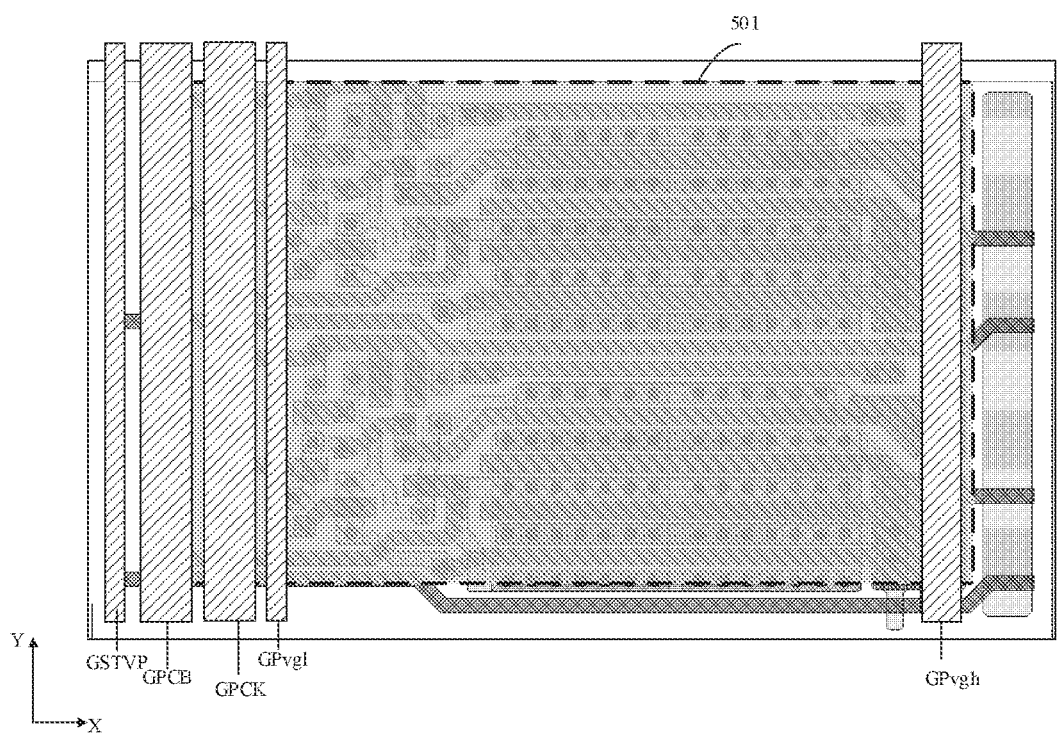
FIG. 5B is a schematic diagram of a partial layout of the third shift register unit illustrated in FIG. 5A on the display substrate.

FIG. 5A is a circuit structure diagram of a third shift register unit provided by at least one embodiment of the present disclosure. FIG. 5B is a schematic diagram of a partial layout of the third shift register unit illustrated in FIG. 5A on the display substrate. As illustrated in FIG. 5A and FIG. 5B, the third shift register unit 231 includes 8 transistors (a first transistor GPT1, a second transistor GPT2, a third transistor GPT3, a fourth transistor GPT4, a fifth transistor GPT5, a sixth transistor GPT6, a seventh transistor GPT7 and an eighth transistor GPT8), two capacitors (a first capacitor GPC1 and a second capacitor GPC2), and a plurality of nodes (GPD1-GPD3).

For example, in the case where a plurality of third shift register units 231 are cascaded, a second electrode of a first transistor GPT1 in a first stage of third shift register unit 231 is connected to an input terminal GPI, and the input terminal GPI is configured to be connected to a trigger signal line GSTVP to receive a trigger signal as an input signal. A second electrode of a first transistor GPT1 in each of the other stages of third shift register units 231 is electrically connected to an output terminal of a previous stage of third shift register unit 231 to receive an output signal output from an output terminal GPOUT of the previous stage of third shift register unit 231 as an input signal, thereby achieving a shift output.

For example, in some embodiments, the trigger signal line GSTVN electrically connected to the first stage of first shift register unit, the trigger signal line ESTV electrically connected to the first stage of second shift register unit, and the trigger signal lines GSTVP electrically connected to the first stage of third shift register unit may all above the second scanning driving circuit, or may all above the first scanning driving circuit, or may all above the third scanning driving circuit, or may all between the first scanning driving circuit and the second scanning driving circuit, or may all between the second scanning driving circuit and the third scanning driving circuit; or two trigger signal lines of the above-mentioned three trigger signal lines are both between the first scanning driving circuit and the second scanning driving circuit, or two trigger signal lines of the above-mentioned three trigger signal lines are both between the second scanning driving circuit and the third scanning driving circuit.

In addition, as illustrated in FIG. 5A and FIG. 5B, the third shift register unit 231 further includes a first clock signal terminal GPCK and a second clock signal terminal GPCB, GPCK also represents the first clock signal line, and GPCB also represents the second clock signal line.

For example, GPvgh represents a fifth voltage signal line and a fifth voltage provided by the fifth voltage signal line, GPvgl represents a sixth voltage signal line and a sixth voltage provided by the sixth voltage signal line, and the sixth voltage is less than the fifth voltage. For example, the fifth voltage is a DC high level, and the sixth voltage is a DC low level.

It should be noted that the working principle of the first shift register unit may refer to the introduction in the art, and details are not repeated herein.

As illustrated in FIG. 5B, the signal lines GPCB, GPCK, GPvgl, and GPvgh may all extend along the second direction (Y-axis direction) and be arranged along the first direction (X-axis direction). Respective transistors (GPT1-GPT8) and respective capacitors (GPC1-GPC2) may be formed in a region 501, the specific layout of respective transistors on the display substrate may be determined according to the requirements, an existing layout in the art may be adopted, and the embodiments of the present disclosure do not limit this.

The third shift register unit includes, but is not limited to, the configuration illustrated in FIG. 5A, and the respective transistors (GPT1-GPT8) may adopt P-type transistors, N-type transistors, or a mixture of P-type transistors and N-type transistors, simply by simultaneously connecting terminal polarities of a selected type of transistor in accordance with terminal polarities of a corresponding transistor in the embodiments of the present disclosure.

It should be noted that the transistors adopted in the first shift register unit, the second shift register unit and the third shift register unit may all be thin film transistors, field effect transistors or other switching devices with the same characteristics. Herein, thin film transistors are taken as an example for illustration, for example, an active layer (a channel region) of a transistor is made of a semiconductor material, such as polycrystalline silicon (e.g., low-temperature polycrystalline silicon or high-temperature polycrystalline silicon), amorphous silicon, indium gallium zinc oxide (IGZO), etc., and a gate electrode, a source electrode, and a drain electrode of the transistor are made of a metal material, such as metallic aluminum or an aluminum alloy. The source electrode and drain electrode of the transistor adopted here may be structurally symmetrical, so that the source electrode and the drain electrode may be structurally indistinguishable. In the embodiments of the present disclosure, in order to distinguish the two electrodes of the transistor except the gate electrode, one electrode is directly described as the first electrode, and the other electrode is described as the second electrode. In addition, in the embodiments of the present disclosure, the electrodes of the capacitor may be metal electrodes or one of the electrodes may be made of a semiconductor material (such as doped polysilicon).

Figure 6:
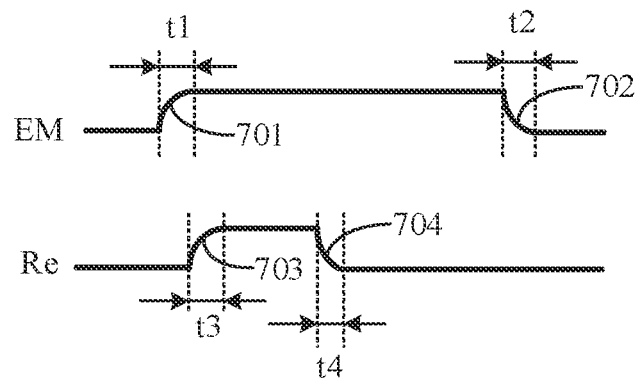
FIG. 6 is a schematic timing diagram of a light-emitting control signal and a first reset control signal provided by at least one embodiment of the present disclosure.

FIG. 6 is a schematic timing diagram of a light-emitting control signal and a first reset control signal provided by at least one embodiment of the present disclosure. EM in FIG. 6 represents the light-emitting control signal. As illustrated in FIG. 6, due to the existence of factors such as the resistance of the first connection wire, during the process that the signal on the first voltage signal line Evgh and the signal on the third voltage signal line Evgl are transmitted to the first gate scanning line, the signals will be delayed, that is, the light-emitting control signal will be delayed. For example, a shift of the output signal of the first scanning driving circuit between a high level and a low level results in the presence of a rising edge 701 and a falling edge 702 of the light-emitting control signal. The duration t1 of the rising edge 701 represents the delay time of the signal on the first voltage signal line Evgh to be transmitted to the first gate scanning line when the first scanning driving circuit is transformed from outputting the voltage of the third voltage signal line Evgl to outputting the voltage of the first voltage signal line Evgh (i.e., transformed from the third voltage (low level) to the first voltage (high level)), and the duration t2 of the falling edge 702 represents the delay time of the signal on the third voltage signal line Evgl to be transmitted to the first gate scanning line when the first scanning driving circuit is transformed from outputting the voltage of the first voltage signal line Evgh to outputting the voltage of the third voltage signal line Evgl (i.e., transformed from a high level to a low level).

For example, Re in FIG. 6 represents the first reset signal. As illustrated in FIG. 6, due to the existence of factors such as the resistance of the second connection wire, during the process that the signal on the second voltage signal line GNvgh and the signal on the fourth voltage signal line GNvgl are transmitted to the second gate scanning line, the signals will be delayed, that is, the first reset control signal will be delayed. For example, a shift of the output signal of the second scanning driving circuit between a high level and a low level results in the presence of a rising edge 703 and a falling edge 704 of the first reset control signal. The duration t3 of the rising edge 703 represents the delay time of the signal on the second voltage signal line GNvgh to be transmitted to the second gate scanning line when the second scanning driving circuit is transformed from outputting the voltage of the fourth voltage signal line GNvgl to outputting the voltage of the second voltage signal line GNvgh (i.e., transformed from the fourth voltage (low level) to the second voltage (high level)), and the duration t4 of the falling edge 704 represents the delay time of the signal on the fourth voltage signal line GNvgl to be transmitted to the second gate scanning line when the second scanning driving circuit is transformed from outputting the voltage of the second voltage signal line GNvgh to outputting the voltage of the fourth voltage signal line GNvgl (i.e., transformed from a high level to a low level).

For example, the factors affecting the delay time of the voltage signal line include not only the resistance of the connection wire, but also the line width of the voltage signal line itself (the line width in the embodiments of the present disclosure may be understood as an average line width). For example, if the line width of a voltage signal line itself is increased, the resistance of the voltage signal line itself will be reduced, the voltage transmission on the voltage signal line will be smoother, and the delay time will be shortened.

For example, the factors affecting the delay time of the first voltage signal line Evgh include not only the resistance of the first connection wire, but also the line width of the first voltage signal line Evgh itself. The delay time of the first voltage signal line Evgh increases with the increase of the resistance of the first connection wire, and shortens with the increase of the line width of the first voltage signal line Evgh. That is, the greater the resistance of the first connection wire, the longer the delay time of the first voltage; and the larger the line width of the first voltage signal line Evgh, the shorter the delay time of the first voltage. The third voltage signal line Evgl is the same as the above, the greater the resistance of the first connection wire, the longer the delay time of the third voltage; and the larger the line width of the third voltage signal line Evgl, the shorter the delay time of the third voltage.

For example, the factors affecting the delay time of the second voltage signal line GNvgh include not only the resistance of the second connection wire, but also the line width of the second voltage signal line GNvgh itself. The delay time of the second voltage signal line GNvgh increases with the increase of the resistance of the second connection wire, and shortens with the increase of the line width of the second voltage signal line GNvgh. That is, the greater the resistance of the second connection wire, the longer the delay time of the second voltage; and the larger the line width of the second voltage signal line GNvgh, the shorter the delay time of the second voltage. The fourth voltage signal line GNvgl is the same as the above, the greater the resistance of the second connection wire, the longer the delay time of the fourth voltage; and the larger the line width of the fourth voltage signal line GNvgl, the shorter the delay time of the fourth voltage.

For example, adjusting the line width of the voltage signal line (such as the first voltage signal line) connected to the first scanning driving circuit and the line width of the voltage signal line (such as the second voltage signal line) connected to the second scanning driving circuit can balance the effect of the resistance of the first connection wire and the resistance of the second connection wire on the delay time, and thereby reduces the difference in the signal delay time due to the difference in the resistances of the first connection wire and the second connection wire.

It should be noted that in the case where the first voltage signal line, the second voltage signal line, the third voltage signal line, and the fourth voltage signal line respectively include a plurality of lines, the average line width of the first voltage signal line may refer to the average line width of first voltage signal lines electrically connected to output transistors of second shift register units included in the first scanning driving circuit, the average line width of the third voltage signal line may refer to the average line width of third voltage signal lines electrically connected to output transistors of second shift register units included in the first scanning driving circuit, the average line width of the second voltage signal line may refer to the average line width of second voltage signal lines electrically connected to output transistors of first shift register units included in the second scanning driving circuit, and the average line width of the fourth voltage signal line may refer to the average line width of fourth voltage signal lines electrically connected to output transistors of first shift register units included in the second scanning driving circuit.

For example, the ratio of the second resistance value R2 to the first resistance value R1 is less than the ratio of the average line width $W_{GNvgh}$ of the second voltage signal line GNvgh to the average line width $W_{Evgh}$ of the first voltage signal line Evgh, that is, $$R2/R1 \leq W_{GNvgh}/W_{Evgh} \qquad (1)$$

For example, the condition illustrated in formula (1) is satisfied by adjusting at least one of the line width of the first voltage signal line Evgh, the line width of the second voltage signal line GNvgh, the first resistance value R1 of the first connection wire 30 and the second resistance value R2 of the second connection wire 40.

Based on this method, at least the difference between the duration of the rising edge of the light-emitting control signal and the duration of the rising edge of the first reset control signal can be reduced, so that the duration of the rising edge of the light-emitting control signal tends to be consistent with the duration of rising edge of the first reset control signal (that is, the difference between the durations of the two rising edges is less than a certain threshold).

For example, the ratio of the second resistance value R2 to the first resistance value R1 is less than the ratio of the average line width $W_{GNvgl}$ of the fourth voltage signal line GNvgl to the average line width $W_{Evgl}$ of the third voltage signal line Evgl, that is, $$R2/R1 \leq W_{GNvgl}/W_{Evgl} \qquad (2)$$

For example, the condition illustrated in formula (2) is satisfied by adjusting at least one of the line width of the third voltage signal line Evgl, the line width of the fourth voltage signal line GNvgl, the first resistance value R1 of the first connection wire 30 and the second resistance value R2 of the second connection wire 40.

Based on this method, at least the difference between the duration of the falling edge of the light-emitting control signal and the duration of the falling edge of the first reset control signal can be reduced, so that the duration of the falling edge of the light-emitting control signal tends to be consistent with the duration of falling edge of the first reset control signal (that is, the difference between the durations of the two falling edges is less than a certain threshold).

For example, the first resistance value R1 of the first connection wire 30 is less than the second resistance value R2 of the second connection wire 40, and the first resistance value R1 of the first connection wire 30 is greater than the third resistance value R3 of the third connection wire 50. Because the distance between the third scanning driving circuit and the pixel region is the shortest, the fourth resistance value R4 of the fourth connection wire 60 is less, and the fourth resistance value R4 is less than the third resistance value R3.

For example, in some examples, the first resistance value R1, the second resistance value R2 and the third resistance value R3 may satisfy the relationships illustrated in the following formulas (3) and (4):

$$1.2 \leq R2/R1 \leq 2.5 \quad (3)$$

$$1.7 \leq (R2+R3)/R1 \leq 3 \quad (4)$$

For example, in some other examples, the first resistance value R1, the second resistance value R2 and the third resistance value R3 may further satisfy the relationships illustrated in the following formulas (5) and (6):

$$1.5 \leq R2/R1 \leq 2.5 \quad (5)$$

$$2 \leq (R2+R3)/R1 \leq 3 \quad (6)$$

For example, the first resistance value R1 and the third resistance value R3 may further satisfy the following relationship:

$$R1/R3 = c*(GN(T(out)W/L))/d*EM(T(out)W/L) \quad (7)$$

In the above relationship, GN(T(out)W/L) represents the width-to-length ratio of an output transistor included in the second scanning driving circuit, such as the width-to-length ratio of the channel of the output transistor GNT9 or GNT10 in FIG. 4A; d represents the total number of rows of pixels driven by one first shift register unit included in the second scanning driving circuit, and EM(T(out)W/L) represents the width-to-length ratio of an output transistor included in the first scanning driving circuit, such as the width-to-length ratio of the channel of the output transistor ET9 or ET10 in FIG. 3A; c is a constant, and $0.5 \leq c \leq 1.5$.

For example, the line width ranges of the first voltage signal line Evgh and the third voltage signal line Evgl of the first scanning driving circuit EMGOA, the line width ranges of the second voltage signal line GNvgh and the fourth voltage signal line GNvgl of the second scanning driving circuit Gate GOA N, and the line width ranges of the fifth voltage signal line GPvgh and the sixth voltage signal line GPvgl of the third driving circuit Gate GOA P may be illustrated in Table 1 below.

TABLE 1

|  | Line width of VGH (μm) | Line width of VGL (μm) |
|---|---|---|
| Gate GOA N | 30-75 | 23-30 |
| Gate GOA P | 8-22 | 6.5 |
| EMGOA | 8-10 | 5-10 |

For example, according to Table 1, $3 \leq W_{GNvgh}/W_{Evgh} \leq 9.4$, combined with the above formula (3) or (5), it can be determined that $R2/R1 \leq W_{GNvgh}/W_{Evgh}$. Based on the range of values in Table 1, the delay time of the rising edge of the light-emitting control signal and the rising edge of the first reset control signal can be substantially consistent.

For example, the average line width of the first voltage signal line and the average line width of the second voltage signal line satisfy the following relationship:

$$W_{GNvgh} = W_{Evgh} * (R2/R1 + R3/R1 + a) \quad (8)$$

In the above formula (8), R1 is the first resistance value, R2 is the second resistance value, R3 is the third resistance value, $W_{GNvgh}$ is the average line width of the second voltage signal line, $W_{Evgh}$ is the average line width of the first voltage signal line, a is a constant, and $0.5 \leq a \leq 7.5$.

The numerical relationship between the resistance of the first connection wire, the resistance of the second connection wire, the resistance of the third connection wire, the line width of the first voltage signal line and the line width of the second voltage signal line is further defined according to the above formula (8), so that the line width of the first voltage signal line and the line width of the second voltage signal line can be accurately regulated, so that the line width of the first voltage signal line and the line width of the second voltage signal line can be more accurately balanced against the difference in the resistances of the various connection wires, so as to further reduce the difference in the durations of the rising edges of the signals.

For example, in some examples, the value range of the constant a in formula (8) may be further limited to: $0.6 \leq a \leq 3$. By narrowing the value range of the constant a, the line width of the first voltage signal line and the line width of the second voltage signal line can be regulated more accurately.

For example, the average line width of the fourth voltage signal line and the average line width of the third voltage signal line may satisfy the following relationship:

$$W_{GNvgl} = W_{Evgl} * (R2/R1 + R3/R1 + b) \quad (9)$$

In formula (9), R1 is the first resistance value, R2 is the second resistance value, R3 is the third resistance value, $W_{GNvgl}$ is the average line width of the fourth voltage signal line, $W_{Evgl}$ is the average line width of the third voltage signal line, b is a constant, and $0.3 \leq b \leq 4.5$.

The numerical relationship between the resistance of the first connection wire, the resistance of the second connection wire, the resistance of the third connection wire, the line width of the third voltage signal line and the line width of the fourth voltage signal line is further defined according to the above formula (9), so that the line width of the third voltage signal line and the line width of the fourth voltage signal line can be accurately regulated, so that the line width of the third voltage signal line and the line width of the fourth voltage signal line can be more accurately balanced against the difference in the resistances of the various connection wires, so as to further reduce the difference in the durations of the falling edges of the signals.

For example, in some examples, the value range of the constant b in formula (9) may be further limited to: $1.5 \leq b \leq 3.5$. By narrowing the value range of the constant b, the line width of the third voltage signal line and the line width of the fourth voltage signal line can be regulated more accurately.

Figure 7:
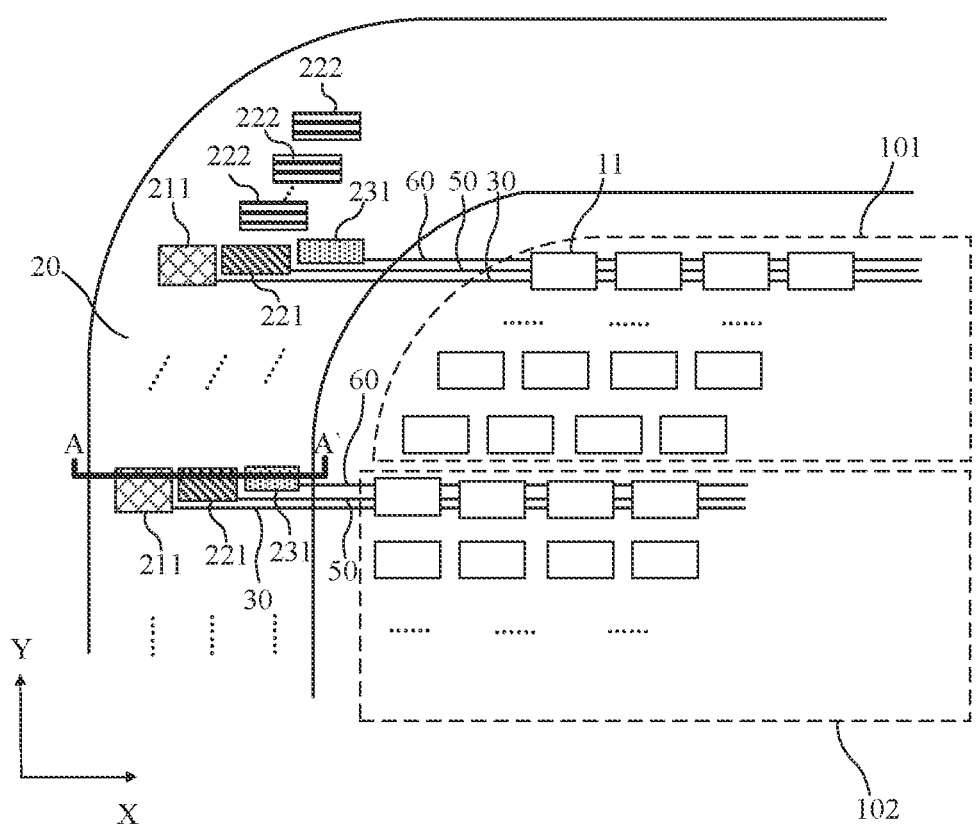
FIG. 7 is a schematic plan view of a partial region of a display substrate provided by at least one embodiment of the present disclosure.

FIG. 7 is a schematic plan view of a partial region of a display substrate provided by at least one embodiment of the present disclosure. As illustrated in FIG. 7, for example, the display region includes a first display sub-region 101 and a second display sub-region 102, the total number of pixel units 11 in each row in the second display sub-region 102 is equal, and the total number of pixel units 11 in any row in the first display sub-region 101 is less than the total number of pixel units 11 in one row in the second display sub-region 102.

For example, the first display sub-region 101 is a corner display region corresponding to a corner of the display substrate. In the first display sub-region 101, the total number of pixel units in each row may increase row by row. The first display sub-region 101 is a normal display region, and in the second display sub-region 102, the total number of pixel units in each row is equal. The total number of pixel units included in each row in the first display sub-region 101 is less than the total number of pixel units in one row in the second display sub-region 102. The peripheral region is provided with a first scanning driving circuit including a second shift register unit 211, a second scanning driving circuit including a first shift register unit 221, and a third scanning driving circuit including a third shift register unit 231. The peripheral region corresponds to the first display sub-region 101 and the second display sub-region 102, and the first scanning driving circuit, the second scanning driving circuit and the third scanning driving circuit can drive the pixel units in the first display sub-region 101 and the second display sub-region 102.

For example, the above formulas (1) to (9) may be applicable to the second display sub-region 102 but not to the first display sub-region 101. Alternatively, the above formulas (1) to (9) may be applicable to the second display sub-region 102 and the first display sub-region 101.

For example, the first display sub-region 101 includes a p-th row of pixel units, and the second display sub-region 102 includes a q-th row of pixel units. The difference value between the resistance value of a first connection wire 30 connected to the p-th row of pixel units and the resistance value of a first connection wire 30 connected to the q-th row of pixel units is the fifth resistance value R5. The difference value between the resistance value of a third connection wire 50 connected to the p-th row of pixel units and the resistance value of a third connection wire 50 connected to the q-th row of pixel units is the sixth resistance value R6. The difference value between the resistance value of a fourth connection wire 60 connected to the p-th row of pixel units and the resistance value of a fourth connection wire 60 connected to the q-th row of pixel units is the seventh resistance value R7. The fifth resistance value, the sixth resistance value and the seventh resistance value all increase with an increase in the total number of pixel units missing from the p-th row of pixel units relative to the q-th row of pixel units, p is an integer greater than 0, and q is an integer greater than p.

For example, taking p=1 and q=10 as an example, the first row of pixel units are in the first display sub-region 101, and the tenth row of pixel units are in the second display sub-region 102. The distances between the pixel unit closest to the peripheral region in the first row of pixel units and respective scanning driving circuits are respectively greater than the distances between the pixel unit closest to the peripheral region in the tenth row of pixel units and respective scanning driving circuits, so the lengths of the connection wires connected to the first row of pixel units are also respectively longer than the lengths of the connection wires connected to the tenth row of pixel units. For example, the resistance value of a first connection wire 30 connected to the tenth row of pixel units is the first resistance value R1, the resistance value of a first connection wire 30 connected to the first row of pixel units increases the fifth resistance value R5 relative to the first resistance value R1, and the greater the total number of missing pixel units of the first row of pixel units relative to the tenth row of pixel units, the greater the fifth resistance value R5. For example, the resistance value of a third connection wire 50 connected to the tenth row of pixel units is the third resistance value R3, the resistance value of a third connection wire 50 connected to the first row of pixel units increases the sixth resistance value R6 relative to the third resistance value R3, and the greater the total number of missing pixel units of the first row of pixel units relative to the tenth row of pixel units, the greater the sixth resistance value R6. For example, the resistance value of a fourth connection wire 60 connected to the tenth row of pixel units is the fourth resistance value R4, the resistance value of a fourth connection wire 60 connected to the first row of pixel units increases the seventh resistance value R7 relative to the fourth resistance value R4, and the greater the total number of missing pixel units of the first row of pixel units relative to the tenth row of pixel units, the greater the seventh resistance value R7.

For example, the fifth resistance value, the sixth resistance value and the seventh resistance value satisfy the following relationship:

$$R5=Rf+e5*(f_p-1)*g5, \; \tfrac{1}{3}W_{pitch} \leq g5 \leq \tfrac{1}{2}W_{pitch}, \; e5=k1/(w1*u1) \quad (10)$$

$$R6=Rf+e6*(f_p-1)*g6, \; \tfrac{1}{3}W_{pitch} \leq g6 \leq \tfrac{1}{2}W_{pitch}, \; e6=k2/(w2*u2) \quad (11)$$

$$R7=Rf+e7*(f_p-1)*g7, \; \tfrac{1}{3}W_{pitch} \leq g7 \leq \tfrac{1}{2}W_{pitch}, \; e7=k4/(w4*u4) \quad (12)$$

In formulas (10), (11) and (12), Rf is the resistance when the total number of pixel units missing from the p-th row of pixel units relative to the q-th row of pixel units is 1; fp is the total number of pixel units missing from the p-th row of pixel units relative to the q-th row of pixel units; e5, e6 and e7 are constants; k1, k2 and k4 are respectively the resistivity of the first connection wire connected to the p-th row of pixel units, the resistivity of the third connection wire connected to the p-th row of pixel units, and the resistivity of the fourth connection wire connected to the p-th row of pixel units; w1, w2 and w4 are respectively the average line width of the first connection wire connected to the p-th row of pixel units, the average line width of the third connection wire connected to the p-th row of pixel units, and the average line width of the fourth connection wire connected to the p-th row of pixel units; u1, u2, and u4 are respectively the average thickness of the first connecting wire connected to the p-th row of pixel units, the average thickness of the third connection wire connected to the p-th row of pixel units, and the average thickness of the fourth connection wire connected to the p-th row of pixel units; g5, g6 and g7 are constants; and $W_{pitch}$ is a dimension of one pixel unit in the first direction.

For example, according to the above formulas (10), (11) and (12), the theoretical resistance difference between each connection wire in the corner region and a corresponding connection wire in the normal display region is determined by parameters such as the missing sub-pixels in each row in the corner region, the dimension of the sub-pixel, and the resistivity of the connection wire. If the connection wires of the corner region and the normal display region satisfy the theoretical resistance difference, a pixel unit in the corner region and a pixel unit at a corresponding position (for example, in the same column) of each row in the normal display region can receive signal with the same delay time. For example, the first pixel unit in the third row in the corner region is in the same column as the fifth pixel unit in each row in the normal display region. By means of the above formulas (10), (11), and (12), it is possible to make the first pixel unit of the third row in the corner region have the same delay time for receiving signals as the fifth pixel unit of each row in the normal display area to minimize the difference in the delay time of the signal due to the corner.

Figure 8:
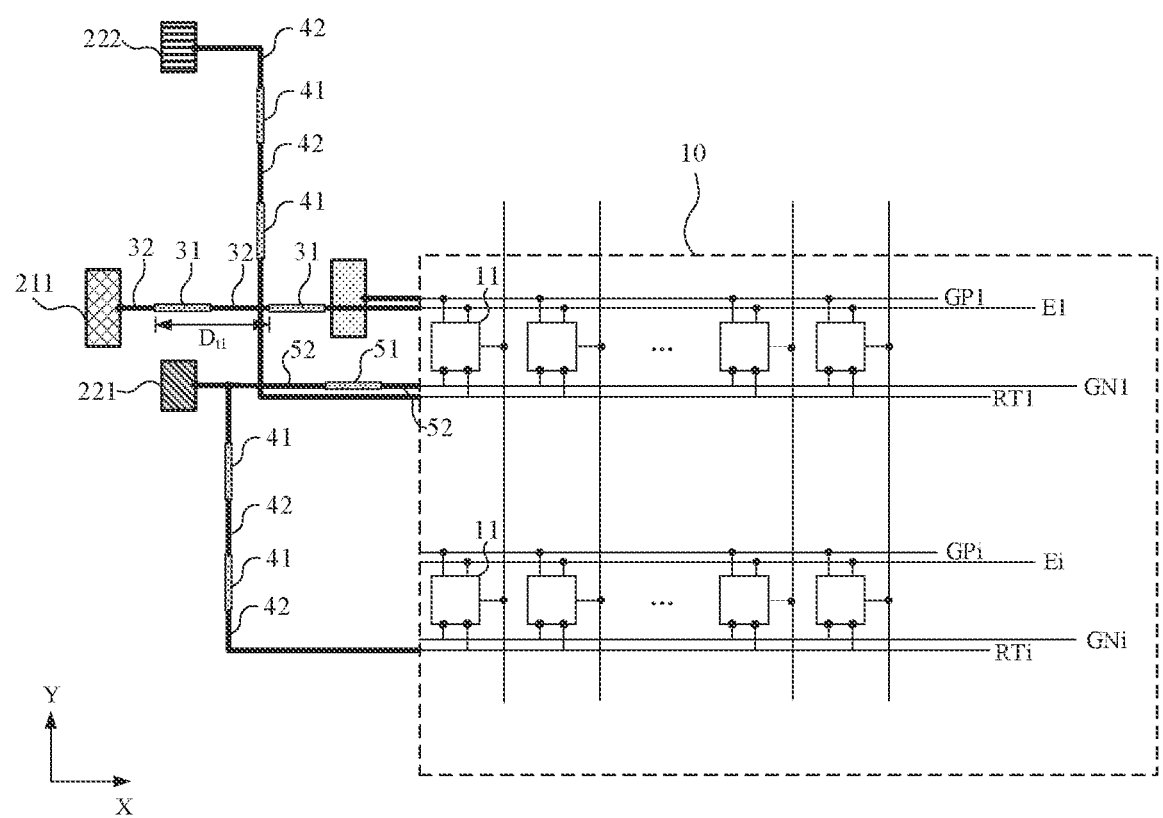
FIG. 8 is a schematic plan view of a partial region of a display substrate provided by at least one embodiment of the present disclosure.

FIG. 8 is a schematic plan view of a partial region of a display substrate provided by at least one embodiment of the present disclosure. As illustrated in FIG. 1 and FIG. 8, the first connection wire 30 includes at least two first transfer electrodes 31 and a plurality of first connection electrodes 32, the at least two first transfer electrodes 31 and the plurality of first connection electrodes 32 are in different layers, the plurality of first connection electrodes 32 are respectively connected to the at least two first transfer electrodes 31 through via holes penetrating through an insulation layer to form the first connection wire 30, and the resistivity of each first transfer electrode 31 is less than the resistivity of each first connection electrode 32. The third connection wire 50 includes at least one second transfer electrode 51 and a plurality of second connection electrodes 52, the at least one second transfer electrode 51 and the plurality of second connection electrodes 52 are in different layers, the plurality of second connection electrodes 52 are respectively connected to the at least one second transfer electrode 51 through via holes penetrating through an insulation layer to form the third connection wire 50, and the resistivity of each second transfer electrode 51 is less than the resistivity of each second connection electrode 52. The total number of the first transfer electrodes 31 is greater than the total number of the second transfer electrodes 51. Because the transfer electrodes and the connection electrodes are in different layers, the transfer electrodes may also be referred to as a cross-layer structure.

For example, both the first scanning driving circuit and the second scanning driving circuit include a layer structure of a semiconductor layer (Poly layer), a first insulation layer, a first conductive layer (Gate1 layer), a second insulation layer, a second conductive layer (Gate2 layer), a third insulation layer, and a third conductive layer (SD1 layer) that are sequentially formed in the direction perpendicular to the base substrate. The first connection electrode 32 may be in the first conductive layer (or the second conductive layer), the first transfer electrode 31 may be in the third conductive layer, and the first connection electrode 32 and the first transfer electrode 31 can be connected through the via holes penetrating through the third insulation layer (or penetrating through the third insulation layer and the second insulation layer). The plurality of first connection electrodes 32 and the at least two first transfer electrodes 31 may all extend along the first direction (X-axis direction), and be sequentially arranged along the first direction, each first transfer electrode 31 may be interspersed between two first connection electrodes 32, and adjacent first connection electrodes 32 and first transfer electrodes 31 are sequentially connected terminal-to-terminal to form the first connection wire 30. The second connection electrode 52 may be in the first conductive layer (or the second conductive layer), the second transfer electrode 51 may be in the third conductive layer, and the second connection electrode 52 and the second transfer electrode 51 can be connected through the via holes penetrating through the third insulation layer (or penetrating through the third insulation layer and the second insulation layer). The plurality of second connection electrodes 52 and the at least one second transfer electrodes 51 may all extend along the first direction (X-axis direction), and be sequentially arranged along the first direction, each second transfer electrode 51 may be interspersed between two second connection electrodes 52, and adjacent second connection electrodes 52 and second transfer electrodes 51 are sequentially connected terminal-to-terminal to form the third connection wire 50.

For example, the resistivity of the material of the first transfer electrode 31 is less than the resistivity of the material of the first connection electrode 32, so the resistance of the first connection wire 30 can be reduced by providing at least two first transfer electrodes 31 on the first connection wire 30, and the resistance of the first connection wire 30 can be adjusted by designing the total number and/or the dimension of the first transfer electrode 31, and the like. For example, the resistivity of the material of the second transfer electrode 51 is less than the resistivity of the material of the second connection electrode 52, so the resistance of the third connection wire 50 can be reduced by providing at least one second transfer electrode 51 on the third connection wire 50, and the resistance of the third connection wire 50 can be adjusted by designing the total number and/or the dimension of the second transfer electrode 51, and the like. The total number of the first transfer electrodes 31 is greater than the total number of the second transfer electrodes 51, so that the resistance difference between the first connection wire 30 and the third connection wire 50 can be reduced.

For example, the distance between two adjacent first transfer electrodes 31 satisfies the following relationship:

$$1.5 W_{pitch} \leq D_{t1} \leq W_{Gn} + W_{Gp} \quad (13)$$

In formula (13), $D_{t1}$ is the distance between two adjacent first transfer electrodes 31, for example, the distance between a first terminal of one first transfer electrode 31 and a first terminal of another adjacent first transfer electrode 31; $W_{pitch}$ is the dimension of one pixel unit in the first direction (X-axis direction), that is, the width of the pixel unit; $W_{Gn}$ is the dimension of the second scanning driving circuit in the first direction, that is, the width of the second scanning driving circuit; $W_{Gp}$ is the dimension of the third scanning driving circuit in the first direction, that is, the width of the third scanning driving circuit.

Based on this method, the distance between two adjacent first transfer electrodes 31 can be accurately set by formula (13) to balance the static electricity and resistance generated by the first connection wire with a longer wire length.

For example, the distance between two connection terminals of each first transfer electrode 31 satisfies the following relationship:

$$L_{t1} = W_{EM} * s_1 \quad (14)$$

In formula (14), $L_{t1}$ is the distance between two connection terminals of each first transfer electrode 31, for example, the distance from a first terminal of one first transfer electrode 31 to a second terminal of the first transfer electrode 31, that is, the length of each first transfer electrode 31 in the first direction; $W_{EM}$ is the dimension of the first scanning driving circuit in the first direction, that is, the width of the first scanning driving circuit; $s_1$ is a constant, and $1/9 \leq s_1 \leq 1/5$.

For example, the distance between two connection terminals of each second transfer electrode 51 satisfies the following relationship:

$$L_{t2}=W_{GN}*s_2 \quad (15)$$

In formula (15), $L_{t2}$ is the distance between two connection terminals of each second transfer electrode 51, for example, the distance from a first terminal of one second transfer electrode 51 to a second terminal of the second transfer electrode 51, that is, the length of each second transfer electrode 51 in the first direction; $W_{GN}$ is the dimension of the second scanning driving circuit in the first direction; $s_2$ is a constant, and $1/11 \leq s_2 \leq 1/9$.

For example, based on formulas (14) and (15), adjusting the dimension of the cross-layer structure according to the dimension of the scanning driving circuit can reduce or eliminate the delay difference caused by the dimension difference of different scanning driving circuits.

As illustrated in FIG. 1 and FIG. 8, for example, the second connection wire 40 includes at least one third transfer electrode 41 extending along a second direction (Y-axis direction) different from the first direction and a plurality of third connection electrode 42 extending along the second direction, the at least one third transfer electrode 41 and the plurality of third connection electrodes 42 are in different layers, and the plurality of third connection electrodes 42 are respectively connected to the at least one third transfer electrode 41 through via holes penetrating through an insulation layer to form the second connection wire 40. The resistivity of the third transfer electrode 41 is less than the resistivity of the third connection electrode 42.

For example, the third connection electrode 42 may be in the first conductive layer (or the second conductive layer), the third transfer electrode 41 may be in the third conductive layer, and the third connection electrode 42 and the third transfer electrode 41 may be connected through via holes penetrating through the third insulation layer (or penetrating through the third insulation layer and the second insulation layer). The plurality of third connection electrodes 42 and the at least one third transfer electrode 41 may all extend along the second direction and be sequentially arranged along the second direction, each third transfer electrode 41 may be interspersed between two third connection electrodes 42, and adjacent third connection electrodes 42 and third transfer electrodes 41 are sequentially connected terminal-to-terminal to form the second connection wire 40.

For example, the resistivity of the material of the third transfer electrode 41 is less than the resistivity of the material of the third connection electrode 42, so the resistance of the second connection wire 40 can be reduced by providing at least one third transfer electrode 41 on the second connection wire 40, and the resistance of the second connection wire 40 can be adjusted by designing the total number and/or the dimension of the third transfer electrode 41, and the like.

For example, the distance between two adjacent third transfer electrodes 41 satisfies the following relationship:

$$1.3W_{pitch1} \leq D_{t3} \leq 2.5W_{pitch1} \quad (16)$$

In formula (16), $D_{t3}$ is the distance between two adjacent third transfer electrodes 41, for example, the distance from a first terminal of one third transfer electrode 41 to a first terminal of another third transfer electrode 41; and $W_{pitch1}$ is the dimension of one pixel unit in the second direction.

Accurately setting the distance between two adjacent third transfer electrodes 41 through formula (16) can reduce resistance and reduce crosstalk with other signal lines introduced into the display region.

Figure 9:
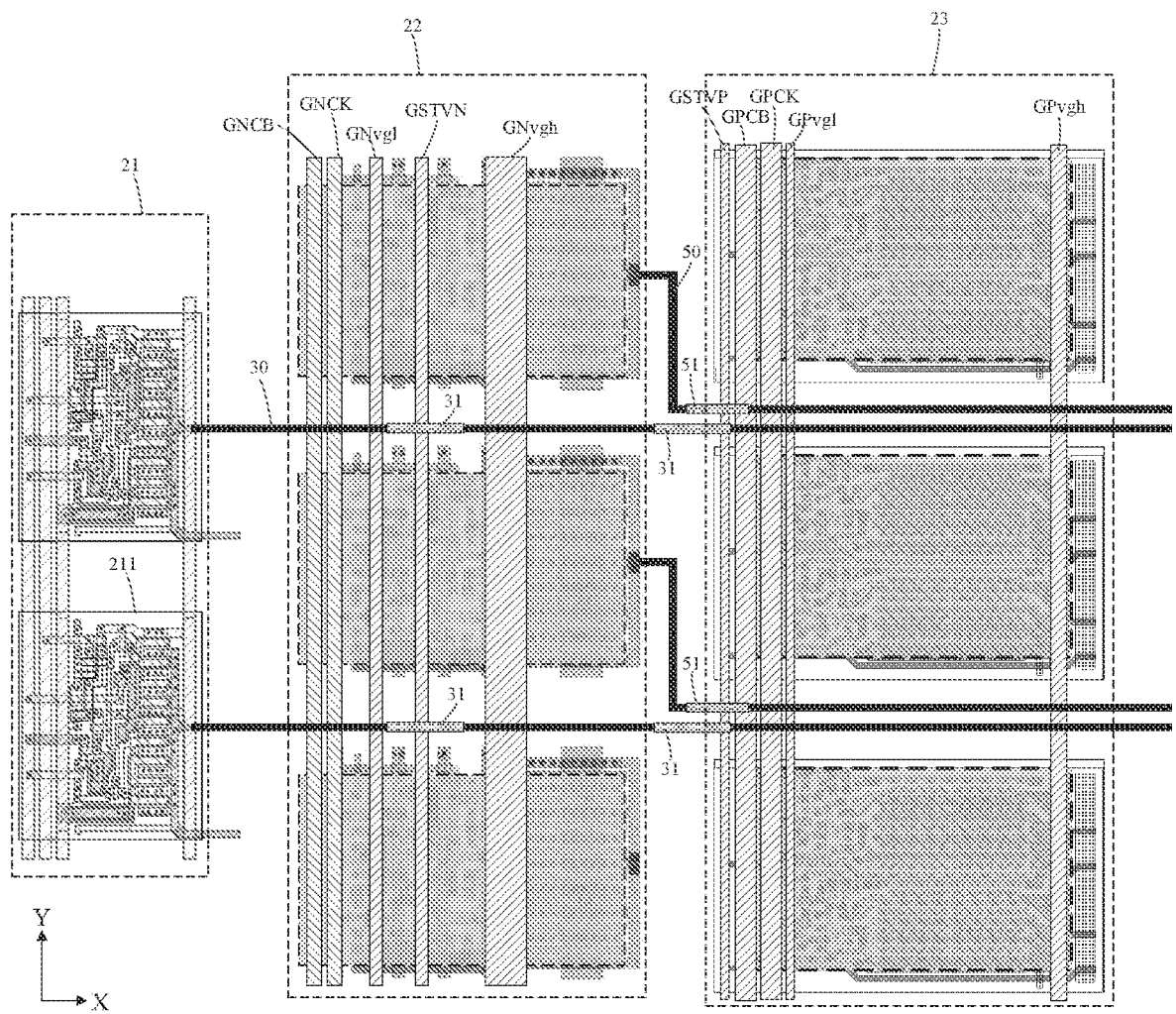
FIG. 9 is a schematic diagram of a partial layout of a peripheral region provided by at least one embodiment of the present disclosure.

FIG. 9 is a schematic diagram of a partial layout of a peripheral region provided by at least one embodiment of the present disclosure. As illustrated in FIG. 9, for example, the first transfer electrode 31 at least partially overlaps with a first signal line of the second scanning driving circuit 22 in the direction perpendicular to the base substrate.

For example, the first signal line may be a clock signal line (GNCB or GNCK) or a trigger signal line (STV signal line such as ESTV, GSTVN or GSTVP) connected to the second scanning driving circuit 22. The orthographic projection of the first transfer electrode 31 of the first connection wire on the base substrate is at least partially overlapped with the orthographic projection of the first signal line of the second scanning driving circuit 22 on the base substrate, and based on this method, crosstalk between signal lines can be reduced.

For example, the second transfer electrode 51 at least partially overlaps with a second signal line of the third scanning driving circuit 23 in the direction perpendicular to the base substrate.

For example, the second signal line may be a clock signal line (GPCB or GPCK) or a trigger signal line (GSTVP) connected to the third scanning driving circuit 23. The orthographic projection of the second transfer electrode 51 of the third connection wire on the base substrate is at least partially overlapped with the orthographic projection of the second signal line of the third scanning driving circuit 23 on the base substrate, and based on this method, crosstalk between signal lines can be reduced.

For example, the pixel unit in the display region includes a light-emitting element, and the light-emitting element includes a first electrode layer, a second electrode layer on a side of the first electrode layer away from the base substrate, and a light-emitting layer between the first electrode layer and the second electrode layer. The display region further includes a pixel defining layer, the pixel defining layer includes an opening, and the opening of the pixel defining layer is configured to define a light-emitting region of a pixel unit of the display region. For example, the first electrode layer is an anode layer, the second electrode layer is a cathode layer, and the light-emitting layer is in the opening of the pixel defining layer.

Figure 10:
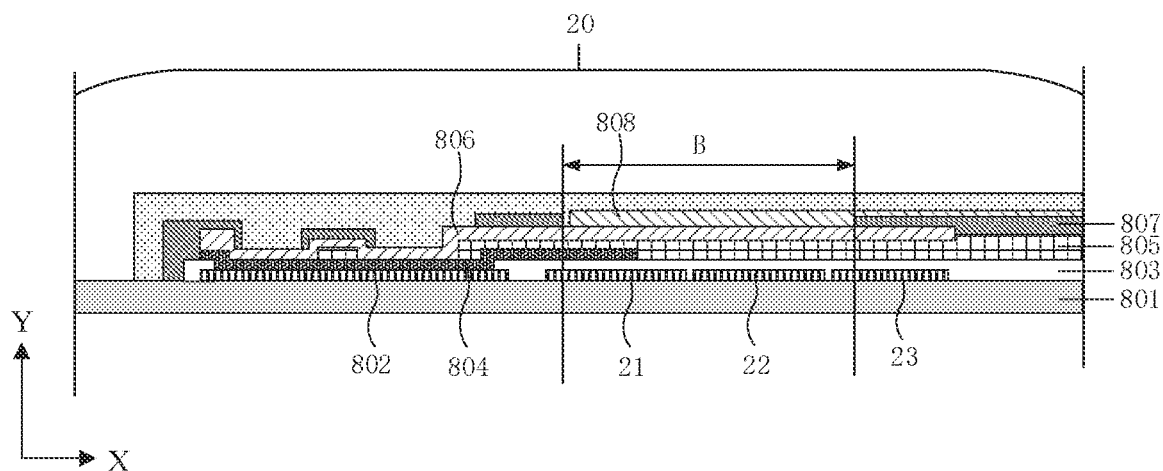
FIG. 10 is a cross-sectional view of some examples of the peripheral region 20 illustrated in FIG. 7 along a direction A-A'.

FIG. 10 is a cross-sectional view of some examples of the peripheral region 20 illustrated in FIG. 7 along a direction A-A'. As illustrated in FIG. 10, for example, the peripheral region 20 includes a base substrate 801 and a first scanning driving circuit 21, a second scanning driving circuit 22, and a third scanning driving circuit 23 that are formed on the base substrate. The first scanning driving circuit 21, the second scanning driving circuit 22 and the third scanning driving circuit 23 may include a plurality of layer structures, for example, including layer structures such as a semiconductor layer (Poly layer), a first insulation layer, a first conductive layer (Gate1 layer), a second insulation layer, a second conductive layer (Gate2 layer), a third insulation layer and a third conductive layer (SD1 layer) that are sequentially formed in the direction perpendicular to the base substrate. For example, the plurality of layer structures included in the first scanning driving circuit 21, the second scanning driving circuit 22 and the third scanning driving circuit 23 may further include a fourth conductive layer (Gate3 layer) between the second conductive layer (Gate2 layer) and the third conductive layer (SD1 layer), and may further include a fifth conductive layer (SD2 layer) on a side of the third conductive layer (SD1 layer) away from the base substrate.

For example, respective signal lines in the first scanning driving circuit 21, the second scanning driving circuit 22 and the third scanning driving circuit 23 may be formed in the first conductive layer to the fifth conductive layer; the source electrodes and drain electrodes of respective transistors in the first scanning driving circuit 21, the second scanning driving circuit 22 and the third scanning driving circuit 23 may be formed in the third conductive layer; the scanning signal lines and connection lines in the first scanning driving circuit 21, the second scanning driving circuit 22 and the third scanning driving circuit 23 may be formed in the first conductive layer, the second conductive layer or the fourth conductive layer; and the respective clock signals in the first scanning driving circuit 21, the second scanning driving circuit 22 and the third scanning driving circuit 23 may be formed in the third conductive layer or the fifth conductive layer. A first portion 802 of the second voltage line VSS connected to the second terminal of the light-emitting element may be formed in the third conductive layer. The peripheral region 20 further includes a fourth insulation layer 803 formed on a side of the scanning driving circuits (the first scanning driving circuit 21, the second scanning driving circuit 22 and the third scanning driving circuit 23) away from the base substrate 801, a second portion 804 of the second voltage line VSS formed on a side of the fourth insulation layer 803 away from the base substrate 801, a fifth insulation layer 805 formed on a side of second portion 804 of the second voltage line VSS away from the base substrate 801, a first auxiliary electrode layer 806 formed on a side of the fifth insulation layer 805 away from the base substrate 801, an auxiliary insulation layer 807 formed on a side of the first auxiliary electrode layer 806 away from the base substrate 801, and a second auxiliary electrode layer 808 formed on a side of the auxiliary insulation layer 807 away from the base substrate 801.

For example, the first auxiliary electrode layer 806 is provided in the same layer as the first electrode layer (i.e., the anode layer) of the light-emitting element included in the pixel unit of the display region. For example, the material of the first auxiliary electrode layer 806 may be the same as the material of the first electrode layer. The auxiliary insulation layer 807 is provided in the same layer as the pixel defining layer in the display region. For example, the material of the auxiliary insulation layer 807 may be the same as the material of the pixel defining layer, and the auxiliary insulation layer 807 and the pixel defining layer may be integrally formed. The second auxiliary electrode layer 808 is provided in the same layer as the second electrode layer (i.e., the cathode layer) in the display region. For example, the material of the second auxiliary electrode layer 808 may be the same as the material of the second electrode layer, and the second auxiliary electrode layer 808 and the second electrode layer may be integrally formed.

For example, the base substrate 10 may be made of glass, plastic, quartz or other suitable materials, which are not limited in the embodiments of the present disclosure.

It should be noted that, for example, the material of the semiconductor layer may include oxide semiconductors, organic semiconductors or amorphous silicon, polysilicon, etc., for example, oxide semiconductors include metal oxide semiconductors (such as indium gallium zinc oxide (IGZO)), and polysilicon includes low-temperature polysilicon or high-temperature polysilicon, etc., which are not limited in the embodiments of the present disclosure. It should be noted that the above-mentioned source electrode and drain electrode may be a region doped with n-type impurities or p-type impurities, which is not limited in the embodiments of the present disclosure.

For example, the material of the third conductive layer may include titanium, titanium alloy, aluminum, aluminum alloy, copper, copper alloy or any other suitable composite material, which is not limited in the embodiments of the present disclosure. For example, the materials of the first conductive layer and the second conductive layer may be the same as the material of the third conductive layer, which will not be repeated here.

For example, the materials of the first insulation layer, the second insulation layer, the third insulation layer, the fourth insulation layer, the fifth insulation layer and the auxiliary insulation layer may include inorganic insulation materials such as SiNx, SiOx, SiNxOy, etc., organic insulation materials such as organic resins, etc., or other suitable materials, which are not limited in the embodiments of the present disclosure.

For example, the first electrode layer (anode layer) and the second electrode layer (cathode layer) of the light-emitting element may be made of materials including transparent metal oxides such as indium tin oxide (ITO) or indium zinc oxide (IZO), which has a high light transmittance. The anode layer and cathode layer of the light-emitting element are made of metal, for example, the metal may be made of magnesium, magnesium alloy, aluminum or aluminum alloy. The material of the first auxiliary electrode layer is the same as the material of the first electrode layer, and the material of the second auxiliary electrode layer is the same as the material of the second electrode layer.

For example, the first auxiliary electrode layer 806 is on a side of the first scanning driving circuit 21 away from the base substrate, and the first auxiliary electrode layer 806 is provided with an electrode vent. At least one terminal of the first transfer electrode 31 at least partially overlaps with the electrode vent in the direction perpendicular to the base substrate; and/or at least one terminal of the second transfer electrode 51 at least partially overlaps with the electrode vent in the direction perpendicular to the base substrate.

For example, the auxiliary insulation layer is provided with at least one opening, and the opening dimension B of the auxiliary insulation layer satisfies the following relationship:

$$0.65 \leq B/(W_{EM}+W_{GN}+W_{GP}) \leq 0.95 \quad (17)$$

In formula (17), B is the dimension of the opening of the auxiliary insulation layer, for example, the dimension along the first direction (X-axis direction); $W_{EM}$ is the dimension of the first scanning driving circuit 21 in the first direction, $W_{GN}$ is the dimension of the second scanning driving circuit 22 in the first direction, and $W_{GP}$ is the dimension of the third scanning driving circuit 23 in the first direction.

Based on the formula (17), the peripheral region can be reasonably utilized to achieve effective overlapping of the cathode layer and the second voltage line VSS.

For example, at least one of the first scanning driving circuit 21, the second scanning driving circuit 22 and the third scanning driving circuit 23 at least partially overlaps with the at least one opening of the auxiliary insulation layer 807 in the direction perpendicular to the base substrate.

For example, the second voltage signal line GNvgh is provided with a plurality of signal line vents. In one example, the dimension of each signal line vent satisfies the following relationship:

$$H1 = z*W_{pitch}, \; 1/7 \leq z \leq 1/3 \quad (18)$$

In formula (18), H1 is the dimension of the signal line vent, and $W_{pitch}$ is the dimension of one pixel unit in the first direction. Based on formula (18), setting the dimension of the signal line vent can reasonably achieve the exhaust function.

For example, in another example, the dimension of the signal line vent satisfies the following relationship:

$$\tfrac{1}{3} W_{GNvgh} \leq H1 \leq \tfrac{1}{2} W_{GNvgh} \tag{19}$$

In the formula (19), H1 is the dimension of the signal line vent, and $W_{GNvgh}$ is the average line width of the second voltage signal line. Based on formula (19), setting the dimension of the signal line vent can reasonably achieve the exhaust function.

For example, each first shift register unit 221 includes a first switch transistor. The difference value between the distance between two adjacent signal line vents and the channel dimension of the first switch transistor is less than a predetermined threshold, and a connection via hole for the first voltage signal line to the first electrode of the second capacitor is between two adjacent signal line vents or at least partially overlaps with the signal line vent.

Figure 11A:
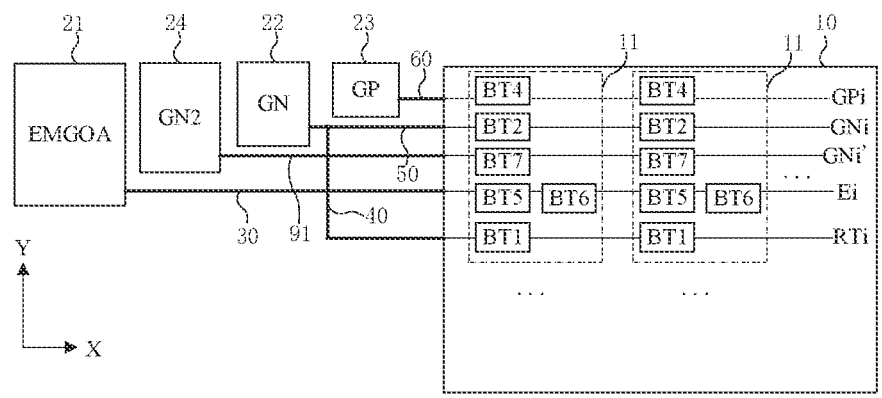
FIG. 11A is a schematic plan view of another display substrate provided by at least one embodiment of the present disclosure.

For example, the first switch transistor may be any one of transistors GNT1-GNT13 in the first shift register unit 221. The channel width-to-length ratios of the transistors GNT2-GNT13 in the first shift register unit 221 are illustrated in Table 2 below, and the unit of width and length is μm (micrometer).

the first reset transistors BT1 of respective pixel units through a plurality of second connection wires 40 and a plurality of second gate scanning signal lines RTi, and the second scanning driving circuit 22 is further connected to the threshold compensation transistors BT2 of respective pixel units through a plurality of third connection wires 50 and a plurality of third gate scanning signal lines GNi. The third scanning driving circuit 23 is connected to the data writing transistors BT4 of respective pixel units through a plurality of fourth connection wires 60 and a plurality of fourth gate scanning signal lines GPi, and the fourth scanning driving circuit 24 is connected to the second reset transistors BT7 of respective pixel units through a plurality of fifth connection wires 91 and the plurality of fifth gate scanning signal lines GNi', in this example, the second reset transistor BT7 may be an N-type transistor. FIG. 11A only illustrates one of the plurality of first connection wires 30, one of the plurality of first gate scanning signal lines Ei, one of the plurality of second connection wires 40, etc., FIG. 11A is only for the purpose of clarifying the connection relationship and facilitating description, and is not intended to limit the total number of lines such as the first connection wires and the first gate scanning signal lines, or to limit the specific connection methods of respective lines and transistors. The same is true for the following FIG. 11B, FIG. 11C and FIG. 11D.

For example, the fourth scanning driving circuit 24 is on a side of the third scanning driving circuit 23 away from the

TABLE 2

| Transistor | GNT2 | GNT3 | GNT4 | GNT5 | GNT6 | GNT7 | GNT8 | GNT9 | GNT10 | GNT11 | GNT12 | GNT13 |
|---|---|---|---|---|---|---|---|---|---|---|---|---|
| width-to-length ratio | 3.5/4.6 | 3.6/3.5 | 3.4/3.6 | 7.6/4.7 | 3.4/3.2 | 3.5/3.2 | 3.7/3.3 | 45.4/3.3 | 45.4/3.3 | 7.6/3 | 7.6/3 | 3.4/5 |

For example, the first switch transistor may be a transistor with a width of approximately 3.5 μm among the transistors GNT2-GNT13, and the first switch transistor is, for example, one of the transistors GNT2, GNT3, GNT4, GNT6, GNT7, GNT8, and GNT13.

FIG. 11A is a schematic plan view of another display substrate provided by at least one embodiment of the present disclosure. As illustrated in FIG. 11A, in addition to the above-mentioned first scanning driving circuit 21 (EMGOA), the second scanning driving circuit 22 (GN) and the third scanning driving circuit 23 (GP), the peripheral region may further include a fourth scanning driving circuit 24 (GN2), and the fourth scanning driving circuit 24 may be, for example, configured to drive N-type transistors.

For example, the display region further includes a plurality of fifth gate scanning signal lines respectively connected to the second reset sub-circuits (BT7 illustrated in FIG. 2) of the plurality of rows of pixel units. The fourth scanning driving circuit is respectively connected to the plurality of fifth gate scanning signal lines through a plurality of fifth connection wires 91 to respectively provide second reset control signals to the second reset sub-circuits of the plurality of rows of pixel units.

For example, as illustrated in FIG. 11A, the first scanning driving circuit 21 is connected to the first light-emitting control transistors BT5 and the second light-emitting control transistors BT6 of respective pixel units through a plurality of first connection wires 30 (only one of which is shown in the figure) and a plurality of first gate scanning signal lines Ei. The second scanning driving circuit 22 is connected to display region 10, the resistance value of each fifth connection wire 91 is an eighth resistance value, and the eighth resistance value is greater than the third resistance value. The fourth scanning driving circuit 24 may be between the first scanning driving circuit 21 and the third scanning driving circuit 23, and the eighth resistance value is less than the first resistance value. The fourth scanning driving circuit 24 may be on a side of the second scanning driving circuit 22 close to the display region 10, or may be on a side of the second scanning driving circuit 22 away from the display region 10, which is not limited in the present disclosure.

For example, the peripheral region further includes a fifth voltage signal line and a sixth voltage signal line, the fourth scanning driving circuit is connected to the fifth voltage signal line to output a fifth voltage as a first portion (for example, a high-level portion) of the second reset control signal, and the fourth scanning driving circuit is connected to the sixth voltage signal line to output a sixth voltage as a second portion (for example, a low-level portion) of the second reset control signal. The average line width of the fifth voltage signal line is larger than the average line width of the first voltage signal line and smaller than the average line width of the third voltage signal line, and the average line width of the sixth voltage signal line is larger than the average line width of the second voltage signal line and smaller than the average line width of the fourth voltage signal line.

Figure 11B:
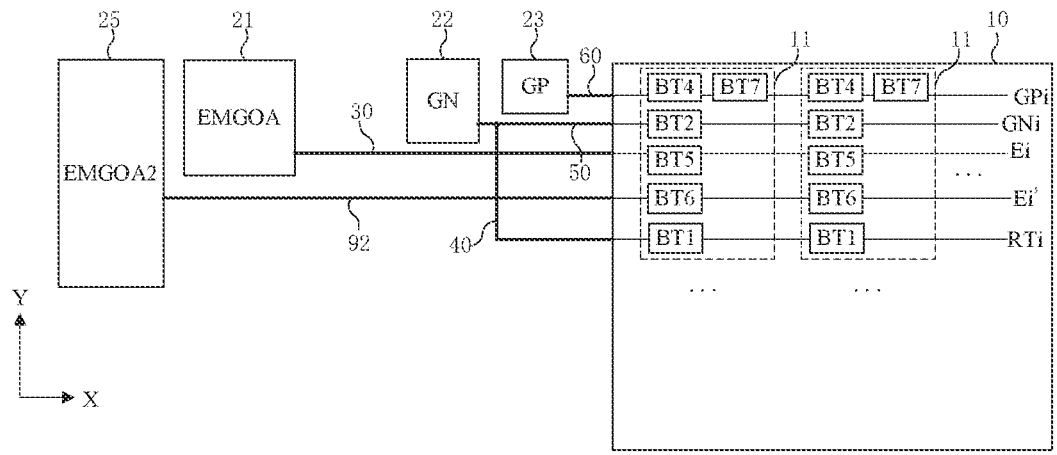
FIG. 11B is a schematic plan view of another display substrate provided by at least one embodiment of the present disclosure.

FIG. 11B is a schematic plan view of another display substrate provided by at least one embodiment of the present disclosure. As illustrated in FIG. 11B, in addition to the above-mentioned first scanning driving circuit 21 (EMGOA), the second scanning driving circuit 22 (GN) and the third scanning driving circuit 23 (GP), the peripheral region may further include a fifth scanning driving circuit 25 (EMGOA2).

For example, the display region further includes a plurality of sixth gate scanning signal lines respectively connected to the light-emitting control sub-circuits of the plurality of rows of pixel units. The fifth scanning driving circuit 25 is respectively connected to the plurality of sixth gate scanning signal lines through a plurality of sixth connection wires 92 to provide light-emitting control signals to the light-emitting control sub-circuits of the plurality of rows of pixel units.

For example, in some examples, the first scanning driving circuit 21 is connected to the first light-emitting control transistors BT5 of respective pixel units through a plurality of first connection wires 30 and a plurality of first gate scanning signal lines Ei, and the fifth scanning driving circuit 25 is connected to the second light-emitting control transistors BT6 of respective pixel units through a plurality of sixth connection wires 92 and a plurality of sixth gate scanning signal lines Ei'. The second scanning driving circuit 22 is connected to the first reset transistors BT1 of respective pixel units through a plurality of second connection wires 40 and a plurality of second gate scanning signal lines RTi, and the second scanning driving circuit 22 is further connected to the threshold compensation transistors BT2 of respective pixel units through a plurality of third connection wires 50 and a plurality of third gate scanning signal lines GNi. The third scanning driving circuit 23 is connected to the data writing transistors BT4 and the second reset transistors BT7 of respective pixel units through a plurality of fourth connection wires 60 and a plurality of fourth gate scanning signal lines GPi. In this example, the second reset transistor BT7 may be a P-type transistor.

Figure 11C:
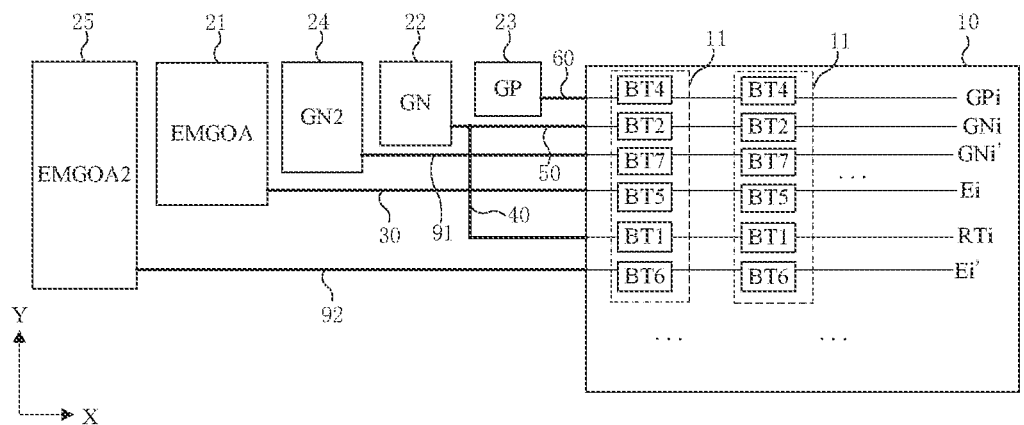
FIG. 11C is a schematic plan view of another display substrate provided by at least one embodiment of the present disclosure.

FIG. 11C is a schematic plan view of another display substrate provided by at least one embodiment of the present disclosure. As illustrated in FIG. 11C, the peripheral region may include a first scanning driving circuit 21 (EMGOA), a second scanning driving circuit 22 (GN), a third scanning driving circuit 23 (GP), a fourth scanning driving circuit 24 (EMGOA) and a fifth scanning driving circuit 25 (EMGOA2).

For example, the first scanning driving circuit 21 is connected to the first light-emitting control transistors BT5 of respective pixel units through a plurality of first connection wires 30 and a plurality of first gate scanning signal lines Ei, and the fifth scanning driving circuit 25 is connected to the second light-emitting control transistors BT6 of respective pixel units through a plurality of sixth connection wires 92 and a plurality of sixth gate scanning signal lines Ei'. The second scanning driving circuit 22 is connected to the first reset transistors BT1 of respective pixel units through a plurality of second connection wires 40 and a plurality of second gate scanning signal lines RTi, and the second scanning driving circuit 22 is further connected to the threshold compensation transistors BT2 of respective pixel units through a plurality of third connection wires 50 and a plurality of third gate scanning signal lines GNi. The third scanning driving circuit 23 is connected to the data writing transistors BT4 of respective pixel units through a plurality of fourth connection wires 60 and a plurality of fourth gate scanning signal lines GPi. The fourth scanning driving circuit 24 is connected to the second reset transistors BT7 of respective pixel units through a plurality of fifth connection wires 91 and a plurality of fifth gate scanning signal lines GNi', and in this example, the second reset transistor BT7 may be an N-type transistor.

Figure 11D:
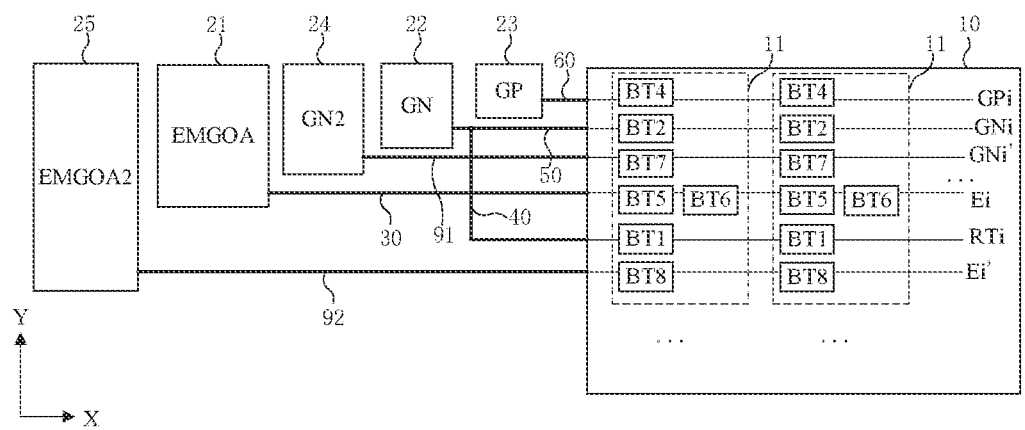
FIG. 11D is a schematic plan view of another display substrate provided by at least one embodiment of the present disclosure.

FIG. 11D is a schematic plan view of another display substrate provided by at least one embodiment of the present disclosure. As illustrated in FIG. 11D, the peripheral region may include a first scanning driving circuit 21 (EMGOA), a second scanning driving circuit 22 (GN), a third scanning driving circuit 23 (GP), a fourth scanning driving circuit 24 (EMGOA) and a fifth scanning driving circuit 25 (EMGOA2).

For example, in some examples, each pixel unit may further include a third light-emitting control transistor BT8 in addition to the first light-emitting control transistor BT5 and the second light-emitting control transistor BT6. The first scanning driving circuit 21 is connected to the first light-emitting control transistors BT5 and the second light-emitting control transistors BT6 of respective pixel units through a plurality of first connection wires 30 and a plurality of first gate scanning signal lines Ei, and the fifth scanning driving circuit 25 is connected to the third light-emitting control transistors BT8 of respective pixel units through a plurality of sixth connection wires 92 and a plurality of sixth gate scanning signal lines Ei'. For example, the second scanning driving circuit 22 is connected to the first reset transistors BT1 of respective pixel units through a plurality of second connection wires 40 and a plurality of second gate scanning signal lines RTi, and the second scanning driving circuit 22 is further connected to the threshold compensation transistors BT2 of respective pixel units through a plurality of third connection wires 50 and a plurality of third gate scanning signal lines GNi. The third scanning driving circuit 23 is connected to the data writing transistors BT4 of respective pixel units through a plurality of fourth connection wires 60 and a plurality of fourth gate scanning signal lines GPi. The fourth scanning driving circuit 24 is connected to the second reset transistors BT7 of respective pixel units through a plurality of fifth connection wires 91 and a plurality of fifth gate scanning signal lines GNi'.

For example, the fifth scanning driving circuit 25 may be on a side of the third scanning driving circuit 23 away from the display region, the resistance value of each sixth connection wire is a ninth resistance value, and the ninth resistance value is greater than the third resistance value. The fifth scanning driving circuit 25 may be on a side of the first scanning driving circuit 21 away from the display region, and the ninth resistance value is greater than the first resistance value.

For example, in some examples, the peripheral region may further include a sixth scanning driving circuit, and the sixth scanning driving circuit may be configured to drive P-type transistors. The display region may further include a plurality of seventh gate scanning signal lines respectively connected to the light-emitting control sub-circuits of the plurality of rows of pixel units. The sixth scanning driving circuit is respectively connected to the plurality of seventh gate scanning signal lines through a plurality of seventh connection wires to respectively provide reset control signals to the second reset sub-circuits of the plurality of rows of pixel units. In this example, the third scanning driving circuit 23 can be connected to the data writing transistors BT4 of respective pixel units through the fourth connection wires 60 and the fourth gate scanning signal lines, and the sixth scanning driving circuit can be connected to the second reset transistors BT7 of respective pixel units through the seventh connection wires and the seventh gate scanning signal lines, and in this example, the second reset transistor BT7 may be a P-type transistor.

For example, in the case where the peripheral region on one side of the display region includes a plurality of scanning driving circuits, for the plurality of scanning driving circuits, the closer a scanning driving circuit is to the display region, the less number of transfer electrodes provided on a connection wire to which the scanning driving circuit is connected. The plurality of scanning driving circuits include a first scanning driving circuit and a second scanning driving circuit, and the connection wires includes a first connection wire and a second connection wire.

For example, in the case where the peripheral region includes the first scanning driving circuit 21, the second scanning driving circuit 22, the third scanning driving circuit 23, the fourth scanning driving circuit 24 and the fifth scanning driving circuit 25, if the third scanning driving circuit 23, the second scanning driving circuit 22, the fourth scanning driving circuit 24, the first scanning driving circuit 21 and the fifth scanning driving circuit 25 are sequentially away from the display region 10, the fourth connection wire 60, the third connection wire 50, the fifth connection wire 91, the first connection wire 30, and the sixth connection wire 92 increase sequentially, and the total number of transfer electrodes provided on the fourth connection wire 60, the total number of transfer electrodes provided on the third connection wire 50, the total number of transfer electrodes provided on the fifth connection wire 91, the total number of transfer electrodes provided on the first connection wire 30, and the total number of transfer electrodes provided on the sixth connection wire 92 can be increased sequentially to reduce the resistance difference between respective connection wires.

Figure 12:
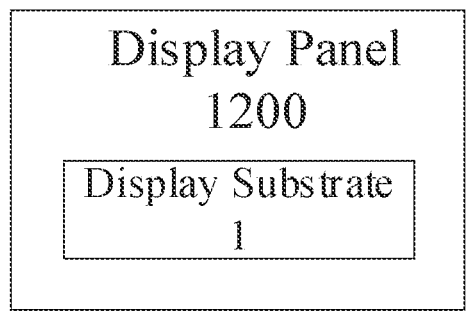
FIG. 12 is a schematic diagram of a display panel provided by at least one embodiment of the present disclosure.

At least one embodiment of the present disclosure further provides a display panel. FIG. 12 is a schematic diagram of a display panel provided by at least one embodiment of the present disclosure. As illustrated in FIG. 12, the display panel 1200 includes the display substrate 1 provided by any embodiment of the present disclosure, for example, the display substrate 1 illustrated in FIG. 1.

For example, the display panel 1200 may be a liquid crystal display panel or an organic light-emitting diode (OLED) display panel, etc. For example, in the case where the display panel 1200 is a liquid crystal display panel, the display substrate 1200 may be an array substrate or a color filter substrate. In the case where the display panel 1200 is an OLED display panel, the display substrate 1200 may be an array substrate.

For example, the display panel 1200 may be a rectangular panel, a circular panel, an elliptical panel, or a polygonal panel, etc. In addition, the display panel 1200 may be not only a flat panel, but also a curved panel, or even a spherical panel.

For example, the display panel 1200 may also have a touch function, that is, the display panel 1200 may be a touch display panel.

For example, the display panel 1200 may be applied to any product or component with a display function, such as a mobile phone, a tablet computer, a television, a monitor, a notebook computer, a digital photo frame, a navigator, and the like.

For example, the display panel 1200 may be a flexible display panel, so as to meet various practical application requirements. For example, the display panel 1200 may be applied to curved screens and the like.

It should be noted that the display panel 1200 may further include other components, such as a data driving circuit, a timing controller, etc., which are not limited in the embodiments of the present disclosure. For the sake of clarity and brevity, the embodiments of the present disclosure do not present all the components of the display panel 1200. In order to realize the basic functions of the display panel 1200, those skilled in the art may provide and arrange other unillustrated structures according to specific needs, which are not limited by the embodiments of the present disclosure.

The technical effects of the display panel 1200 provided in the above embodiments can refer to the technical effects of the display substrate 1 provided in the embodiments of the present disclosure, which will not be repeated here.

The following statements should be noted:
(1) The drawings of the present disclosure involve only the structure(s) in connection with the embodiment(s) of the present disclosure, and other structure(s) can be referred to common design(s).
(2) In case of no conflict, features in one embodiment or in different embodiments can be combined to obtain new embodiments.

What have been described above are only exemplary embodiments of the present disclosure, and are not intended to limit the protection scope of the present disclosure, and the protection scope of the present disclosure is determined by the appended claims.

The invention claimed is:
1. A display substrate, comprising:
a base substrate, wherein the base substrate comprises a display region and a peripheral region on at least one side of the display region,
and the display region comprises a plurality of rows and columns of pixel units arranged in an array, a plurality of first gate scanning signal lines respectively connected to light-emitting control sub-circuits of a plurality of rows of pixel units in the plurality of rows and columns of pixel units, and a plurality of second gate scanning signal lines respectively connected to first reset sub-circuits of the plurality of rows of pixel units;
the peripheral region comprises:
a first scanning driving circuit, respectively connected to the plurality of first gate scanning signal lines through a plurality of first connection wires to respectively provide a light-emitting control signal to the light-emitting control sub-circuits of the plurality of rows of pixel units, wherein a resistance value of each of the first connection wires is a first resistance value;
a second scanning driving circuit, on a side of the first scanning driving circuit close to the display region, and respectively connected to the plurality of second gate scanning signal lines through a plurality of second connection wires to respectively provide a first reset control signal to the first reset sub-circuits of the plurality of rows of pixel units, wherein a resistance value of each of the second connection wires is a second resistance value;
a first voltage signal line, configured to provide a first voltage; and
a second voltage signal line, configured to provide a second voltage,
wherein the first scanning driving circuit is connected to the first voltage signal line to output the first voltage as a first portion of the light-emitting control signal,
the second scanning driving circuit is connected to the second voltage signal line to output the second voltage as a first portion of the first reset control signal, and a ratio of the second resistance value to the first resistance value is less than a ratio of an average line width of the second voltage signal line to an average line width of the first voltage signal line.

2. The display substrate according to claim 1, wherein the peripheral region further comprises:
a third voltage signal line, configured to provide a third voltage; and
a fourth voltage signal line, configured to provide a fourth voltage,
wherein the first scanning driving circuit is further connected to the third voltage signal line to output the third voltage as a second portion of the light-emitting control signal;
the second scanning driving circuit is further connected to the fourth voltage signal line to output the fourth voltage as a second portion of the first reset control signal; and
the third voltage is less than the first voltage, and the fourth voltage is less than the second voltage.

3. The display substrate according to claim 2,
wherein the ratio of the second resistance value to the first resistance value is less than a ratio of an average line width of the fourth voltage signal line to an average line width of the third voltage signal line.

4. The display substrate according to claim 2,
wherein the display region further comprises a plurality of third gate scanning signal lines respectively connected to threshold compensation sub-circuits of the plurality of rows of pixel units; and
the second scanning driving circuit is further connected to the plurality of third gate scanning signal lines through a plurality of third connection wires to respectively provide threshold compensation control signals to the threshold compensation sub-circuits of the plurality of rows of pixel units, and a resistance value of each of the third connection wires is a third resistance value.

5. The display substrate according to claim 4,
wherein the display region further comprises a plurality of fourth gate scanning signal lines respectively connected to data writing sub-circuits of the plurality of rows of pixel units;
the peripheral region further comprises a third scanning driving circuit, and the third scanning driving circuit is respectively connected to the plurality of fourth gate scanning signal lines through a plurality of fourth connection wires to respectively provide data writing control signals to the data writing sub-circuits of the plurality of rows of pixel units;
the second scanning driving circuit is between the first scanning driving circuit and the third scanning driving circuit relative to the display region; and
a resistance value of each of the fourth connection wires is a fourth resistance value, and the fourth resistance value is less than the third resistance value.

6. The display substrate according to claim 4, wherein the average line width of the first voltage signal line and the average line width of the second voltage signal line satisfy a following relationship:

$W_{GNvgh}=W_{Evgh}*(R2/R1+R3/R1+a)$, where R1 is the first resistance value, R2 is the second resistance value, R3 is the third resistance value, $W_{GNvgh}$ is the average line width of the second voltage signal line, $W_{Evgh}$ is the average line width of the first voltage signal line, a is a constant, and 0.5≤a≤7.5; or wherein the average line width of the first voltage signal line and the average line width of the second voltage signal line satisfy a following relationship:

$W_{GNvgh}=W_{Evgh}*(R2/R1+R3/R1+a)$, where R1 is the first resistance value, R2 is the second resistance value, R3 is the third resistance value, $W_{GNvgh}$ is the average line width of the second voltage signal line, $W_{Evgh}$ is the average line width of the first voltage signal line, a is a constant, and 0.6≤a≤3.

7. The display substrate according to claim 4, wherein the average line width of the fourth voltage signal line and the average line width of the third voltage signal line satisfy a following relationship:

$WG_{Nvgl}=W_{Evgl}*(R2/R1+R3/R1+b)$, where R1 is the first resistance value, R2 is the second resistance value, R3 is the third resistance value, $WG_{Nvgl}$ is the average line width of the fourth voltage signal line, $W_{Evgl}$ is the average line width of the third voltage signal line, b is a constant, and 0.3≤b≤4.5; or wherein the average line width of the fourth voltage signal line and the average line width of the third voltage signal line satisfy a following relationship:

$W_{GNvgl}=W_{Evgl}*(R2/R1+R3/R1+b)$, where R1 is the first resistance value, R2 is the second resistance value, R3 is the third resistance value, $WG_{Nvgl}$ is the average line width of the fourth voltage signal line, $W_{Evgl}$ is the average line width of the third voltage signal line, b is a constant, and 1.5≤b≤3.5.

8. The display substrate according to claim 4, wherein the first resistance value, the second resistance value, and the third resistance value satisfy a following relationship:

1.2≤R2/R1≤2.5; and 1.7≤(R2+R3)/R1≤3; or wherein the first resistance value, the second resistance value, and the third resistance value satisfy a following relationship:

1.5≤R2/R1≤2.5; and

2≤(R2+R3)/R1≤3; and wherein the first resistance value and the third resistance value satisfy a following relationship:

$R1/R3=c*(GN(T(out)W/L))/d*EM(T(out)W/L)$, where GN (T (out) W/L) represents a width-to-length ratio of an output transistor comprised in the second scanning driving circuit, and d represents a total number of rows of pixels driven by one first shift register unit comprised in the second scanning driving circuit, EM (T (out) W/L) represents a width-to-length ratio of an output transistor comprised in the first scanning driving circuit, c is a constant, and 0.5≤c≤1.5.

9. The display substrate according to claim 4, wherein the second scanning driving circuit comprises a plurality of cascaded first shift register units;
an i-th first shift register unit is connected to an i-th third gate scanning signal line through an i-th third connection wire, and the i-th third gate scanning signal line is connected to threshold compensation sub-circuits of an i-th row of pixel units; and
the i-th first shift register unit is further connected to an (i+n)-th second gate scanning signal line through an (i+n)-th second connection wire, the (i+n)-th second gate scanning signal line is connected to first reset sub-circuits of an (i+n)-th row of pixel units, and both i and n are integers greater than 0;

wherein the second scanning driving circuit further comprises n cascaded additional shift register units respectively connected to n second gate scanning signal lines respectively corresponding to first n rows of pixel units through n second connection wires to provide the first reset control signals to first reset sub-circuits in the first n rows of pixel units;

a j-th additional shift register unit is connected to a j-th second gate scanning signal line through a j-th second connection wire, and the j-th second gate scanning signal line is connected to a j-th row of pixel units; and j is an integer greater than or equal to 1 and less than or equal to n.

10. The display substrate according to claim 4, wherein the display region comprises a first display sub-region and a second display sub-region, a total number of pixel units in each row in the second display sub-region is equal, and a total number of pixel units in any row in the first display sub-region is less than a total number of pixel units in one row in the second display sub-region;

wherein the first display sub-region comprises a p-th row of pixel units, and the second display sub-region comprises a q-th row of pixel units;

a difference value between a resistance value of a first connection wire connected to the p-th row of pixel units and a resistance value of a first connection wire connected to the q-th row of pixel units is a fifth resistance value;

a difference value between a resistance value of a third connection wire connected to the p-th row of pixel units and a resistance value of a third connection wire connected to the q-th row of pixel units is a sixth resistance value;

a difference value between a resistance value of a fourth connection wire connected to the p-th row of pixel units and a resistance value of a fourth connection wire connected to the q-th row of pixel units is a seventh resistance value;

the fifth resistance value, the sixth resistance value and the seventh resistance value all increase with an increase in a total number of pixel units missing from the p-th row of pixel units relative to the q-th row of pixel units; and p is an integer greater than 0, and q is an integer greater than p;

wherein the fifth resistance value, the sixth resistance value and the seventh resistance value satisfy a following relationship:

$$R5 = Rf + e5*(f_p-1)*g5,\ 1/3 W_{pitch} \le g5 \le 1/2 W_{pitch},\ e5 = k1/(w1*u1)$$

$$R6 = Rf + e6*(f_p-1)*g6,\ 1/3 W_{pitch} \le g6 \le 1/2 W_{pitch},\ e6 = k2/(w2*u2)$$

$$R7 = Rf + e7*(f_p-1)*g7,\ 1/3 W_{pitch} \le g7 \le 1/2 W_{pitch},\ e7 = k4/(w4*u4)$$

where

Rf is a resistance when the total number of pixel units missing from the p-th row of pixel units relative to the q-th row of pixel units is 1;

$f_p$ is the total number of pixel units missing from the p-th row of pixel units relative to the q-th row of pixel units;

e5, e6 and e7 are constants;

k1, k2 and k4 are respectively a resistivity of the first connection wire connected to the p-th row of pixel units, a resistivity of the third connection wire connected to the p-th row of pixel units, and a resistivity of the fourth connection wire connected to the p-th row of pixel units;

w1, w2 and w4 are respectively an average line width of the first connection wire connected to the p-th row of pixel units, an average line width of the third connection wire connected to the p-th row of pixel units, and an average line width of the fourth connection wire connected to the p-th row of pixel units;

u1, u2, and u4 are respectively an average thickness of the first connecting wire connected to the p-th row of pixel units, an average thickness of the third connection wire connected to the p-th row of pixel units, and an average thickness of the fourth connection wire connected to the p-th row of pixel units;

g5, g6 and g7 are constants; and $W_{pitch}$ is a dimension of one pixel unit in a first direction.

11. The display substrate according to claim 4, wherein the peripheral region comprises a third scanning driving circuit, and the third scanning driving circuit is configured to provide data writing control signals to data writing sub-circuits of the plurality of rows of pixel units;

the first connection wire comprises at least two first transfer electrodes and a plurality of first connection electrodes, the at least two first transfer electrodes and the plurality of first connection electrodes are in different layers, the plurality of first connection electrodes are respectively connected to the at least two first transfer electrodes through via holes penetrating through an insulation layer to form the first connection wire, and a resistivity of each of the at least two first transfer electrodes is less than a resistivity of each of the plurality of first connection electrodes;

the third connection wire comprises at least one second transfer electrode and a plurality of second connection electrodes, the at least one second transfer electrode and the plurality of second connection electrodes are in different layers, the plurality of second connection electrodes are respectively connected to the at least one second transfer electrode through via holes penetrating through an insulation layer to form the third connection wire, and a resistivity of each of the at least one second transfer electrode is less than a resistivity of each of the plurality of second connection electrodes; and a total number of the at least two first transfer electrodes is greater than a total number of the at least one second transfer electrode;

wherein a distance between two adjacent first transfer electrodes satisfies a following relationship:

$$1.5 W_{pitch} \le D_{t1} \le W_{Gn} + W_{Gp},$$

where $D_{t1}$ is the distance between two adjacent first transfer electrodes, $W_{pitch}$ is a dimension of one pixel unit in a first direction, $W_{Gn}$ is a dimension of the second scanning driving circuit in the first direction, and $W_{Gp}$ is a dimension of the third scanning driving circuit in the first direction.

12. The display substrate according to claim 11, wherein a distance between two connection terminals of each first transfer electrode satisfies:

$$L_{t1} = W_{EM}*s_1,$$

where $L_{t1}$ is the distance between the two connection terminals of each first transfer electrode, $W_{EM}$ is a dimension of the first scanning driving circuit in a first direction, $s_1$ is a constant, and $1/9 \le s_1 \le 1/5$;

a distance between two connection terminals of each second transfer electrode satisfies:

$$L_{t2} = W_{GN} * s_2,$$

where $L_{t2}$ is the distance between the two connection terminals of each second transfer electrode, $W_{GN}$ is a dimension of the second scanning driving circuit in the first direction, $s_2$ is a constant, and $1/11 \le s_2 \le 1/9$.

13. The display substrate according to claim 11, wherein the second connection wire comprises at least one third transfer electrode extending along a second direction different from a first direction and a plurality of third connection electrodes extending along the second direction, the at least one third transfer electrode and the plurality of third connection electrodes are in different layers, the plurality of third connection electrodes are respectively connected to the at least one third transfer electrode through via holes penetrating through an insulation layer to form the second connection wire, and a resistivity of the third transfer electrode is less than a resistivity of the third connection electrode;

a distance between two adjacent third transfer electrodes satisfies:

$$1.3 W_{pitch1} \le D_{t3} \le 2.5 W_{pitch1},$$

where $D_{t3}$ is the distance between two adjacent third transfer electrodes, and $W_{pitch1}$ is a dimension of one pixel unit in the second direction;

wherein the first transfer electrode at least partially overlaps with a first signal line of the second scanning driving circuit in a direction perpendicular to the base substrate; and/or the second transfer electrode at least partially overlaps with a second signal line of the third scanning driving circuit in the direction perpendicular to the base substrate; and wherein the peripheral region further comprises a first auxiliary electrode layer, the pixel unit in the display region comprises a light-emitting element, and the light-emitting element comprises a first electrode layer, a second electrode layer on a side of the first electrode layer away from the base substrate, and a light-emitting layer between the first electrode layer and the second electrode layer;

the first auxiliary electrode layer is provided in a same layer as the first electrode layer of the light-emitting element comprised in the pixel unit in the display region;

the first auxiliary electrode layer is on a side of the first scanning driving circuit away from the base substrate, and the first auxiliary electrode layer is provided with an electrode vent;

at least one terminal of the first transfer electrode at least partially overlaps with the electrode vent in a direction perpendicular to the base substrate; and/or at least one terminal of the second transfer electrode at least partially overlaps with the electrode vent in the direction perpendicular to the base substrate.

14. The display substrate according to claim 9,
wherein the second voltage signal line is provided with a signal line vent, and a dimension of the signal line vent satisfies:

$$H1 = z * W_{pitch},$$

where H1 is the dimension of the signal line vent, $W_{pitch}$ is a dimension of one pixel unit in a first direction, z is a constant, and $1/7 \le z \le 1/3$; or wherein the second voltage signal line is provided with a signal line vent, and a dimension of the signal line vent satisfies:

$$1/3 W_{GNvgh} \le H1 \le 1/2 W_{GNvgh},$$

where H1 is the dimension of the signal line vent, and $W_{GNvgh}$ is an average line width of the second voltage signal line;

wherein each first shift register unit comprises a first switch transistor;

a difference value between a distance between two adjacent signal line vents and a channel dimension of the first switch transistor is less than a predetermined threshold, and a connection via hole for the first voltage signal line to the first electrode of a second capacitor is between two adjacent signal line vents or at least partially overlaps with the signal line vent.

15. The display substrate according to claim 13,
wherein the display region further comprises a pixel defining layer, the pixel defining layer comprises an opening, and the opening is configured to define a light-emitting region of a pixel unit of the display region;

the peripheral region further comprises an auxiliary insulation layer and a second auxiliary electrode layer, the auxiliary insulation layer is provided in a same layer as the pixel defining layer in the display region, the second auxiliary electrode layer is provided in a same layer as the second electrode layer in the display region, the auxiliary insulation layer is on a side of the first auxiliary electrode layer away from the base substrate, and the second auxiliary electrode layer is on a side of the auxiliary insulation layer away from the base substrate;

the auxiliary insulation layer is provided with at least one opening;

a dimension of the opening of the auxiliary insulation layer satisfies:

$$0.65 \le B/(W_{EM} + W_{GN} + W_{GP}) \le 0.95,$$

where B is the dimension of the opening of the auxiliary insulation layer, $W_{EM}$ is a dimension of the first scanning driving circuit in a first direction, $W_{GN}$ is a dimension of the second scanning driving circuit in the first direction, and $W_{GP}$ is a dimension of the third scanning driving circuit in the first direction; and wherein at least one of the first scanning driving circuit, the second scanning driving circuit and the third scanning driving circuit at least partially overlaps with the at least one opening of the auxiliary insulation layer in the direction perpendicular to the base substrate.

16. The display substrate according to claim 11,
wherein in a case where the peripheral region on one side of the display region comprises a plurality of scanning driving circuits, for the plurality of scanning driving circuits, the closer a scanning driving circuit is to the display region, the less number of transfer electrodes provided on a connection wire to which the scanning driving circuit is connected; and the plurality of scanning driving circuits comprise the first scanning driving circuit and the second scanning driving circuit, and the connection wire comprises a first connection wire of the first connection wires and a second connection wire of the second connection wires.

17. The display substrate according to claim 5,
wherein the display region further comprises a plurality of fifth gate scanning signal lines respectively connected to second reset sub-circuits of the plurality of rows of pixel units;
the peripheral region further comprises a fourth scanning driving circuit, and the fourth scanning driving circuit is respectively connected to the plurality of fifth gate scanning signal lines through a plurality of fifth connection wires to respectively provide second reset control signals to the second reset sub-circuits of the plurality of rows of pixel units;
the fourth scanning driving circuit is on a side of the third scanning driving circuit away from the display region; and
a resistance value of each fifth connection wire is an eighth resistance value, and the eighth resistance value is greater than the third resistance value;
wherein the fourth scanning driving circuit is between the first scanning driving circuit and the third scanning driving circuit; and
the eighth resistance value is less than the first resistance value;
wherein the peripheral region further comprises a fifth voltage signal line and a sixth voltage signal line;
the fourth scanning driving circuit is connected to the fifth voltage signal line to output a fifth voltage as a first portion of the second reset control signal, and the fourth scanning driving circuit is connected to the sixth voltage signal line to output a sixth voltage as a second portion of the second reset control signal;
an average line width of the fifth voltage signal line is larger than the average line width of the first voltage signal line and smaller than the average line width of the third voltage signal line; and
an average line width of the sixth voltage signal line is larger than the average line width of the second voltage signal line and smaller than the average line width of the fourth voltage signal line.

18. The display substrate according to claim 5,
wherein the display region further comprises a plurality of sixth gate scanning signal lines respectively connected to light-emitting control sub-circuits of the plurality of rows of pixel units;
the peripheral region further comprises a fifth scanning driving circuit, and the fifth scanning driving circuit is respectively connected to the plurality of sixth gate scanning signal lines through a plurality of sixth connection wires to provide light-emitting control signals to the light-emitting control sub-circuits of the plurality of rows of pixel units;
the fifth scanning driving circuit is on a side of the third scanning driving circuit away from the display region; and
a resistance value of each sixth connection wire is a ninth resistance value, and the ninth resistance value is greater than the third resistance value;
wherein the fifth scanning driving circuit is on a side of the first scanning driving circuit away from the display region; and
the ninth resistance value is greater than the first resistance value.

19. The display substrate according to claim 5,
wherein each of the plurality of rows and columns of pixel units comprises a light-emitting element and a pixel circuit that drives the light-emitting element to emit light, and the pixel circuit comprises a driving sub-circuit, the data writing sub-circuit, the threshold compensation sub-circuit, a reset sub-circuit and a light-emitting control sub-circuit;
the driving sub-circuit comprises a control terminal, a first terminal and a second terminal, and is configured to control a driving current flowing through the light-emitting element;
the data writing sub-circuit is connected to the first terminal of the driving sub-circuit, a data line and a fourth gate scanning signal line, and is configured to write a data signal provided by the data line into the first terminal of the driving sub-circuit in response to the data writing control signal provide by the fourth gate scanning signal line;
the threshold compensation sub-circuit is connected to the control terminal and the second terminal of the driving sub-circuit, a first voltage line and the third gate scanning signal line, and is configured to compensate the driving sub-circuit in response to the threshold compensation control signal provided by the third gate scanning signal line and the data signal that is written;
the reset sub-circuit comprises a first reset sub-circuit, and the first reset sub-circuit is connected to the second terminal of the driving sub-circuit, an initial signal line and the second gate scanning signal line, and is configured to apply an initial voltage provided by the initial signal line to the second terminal of the driving sub-circuit in response to the first reset control signal provided by the second gate scanning signal line; and
the light-emitting control sub-circuit comprises a first light-emitting control sub-circuit, and the first light-emitting control sub-circuit is connected to the first voltage line, the first terminal of the driving sub-circuit and the first gate scanning signal line, and is configured to apply a first voltage provided by the first voltage line to the first terminal of the driving sub-circuit in response to the light-emitting control signal provided by the first gate scanning signal line;
wherein the reset sub-circuit further comprises a second reset sub-circuit, the plurality of fourth gate scanning signal lines are respectively connected to the second reset sub-circuits of the plurality of rows of pixel units, and the third scanning driving circuit respectively provides second reset control signals to the second reset sub-circuits of the plurality of rows of pixel units through the plurality of fourth gate scanning signal lines;
the second reset sub-circuit is connected to the initial signal line, the fourth gate scanning signal line and a first terminal of the light-emitting element, and is configured to apply the initial voltage provided by the initial signal line to the first terminal of the light-emitting element in response to the second reset control signal provided by the fourth gate scanning signal line; and
the light-emitting control sub-circuit further comprises a second light-emitting control sub-circuit, and the second light-emitting control sub-circuit is connected to the second terminal of the driving sub-circuit, the first terminal of the light-emitting element and the first gate scanning signal line, and is configured to apply the driving current to the first terminal of the light-emitting element in response to the light-emitting control signal provided by the first gate scanning signal line.

20. A display panel, comprising the display substrate according to claim 1.

* * * * *